(12) United States Patent
Lee et al.

(10) Patent No.: US 8,833,294 B2
(45) Date of Patent: Sep. 16, 2014

(54) THIN FILM DEPOSITION APPARATUS INCLUDING PATTERNING SLIT SHEET AND METHOD OF MANUFACTURING ORGANIC LIGHT-EMITTING DISPLAY DEVICE WITH THE SAME

(75) Inventors: Myung-Ki Lee, Yongin (KR); Sung-Bong Lee, Yongin (KR); Myong-Hwan Choi, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 120 days.

(21) Appl. No.: 13/194,759

(22) Filed: Jul. 29, 2011

(65) Prior Publication Data
US 2012/0028390 A1 Feb. 2, 2012

(30) Foreign Application Priority Data
Jul. 30, 2010 (KR) ........................ 10-2010-0074382

(51) Int. Cl.
| | |
|---|---|
| *B05C 11/11* | (2006.01) |
| *B05C 1/00* | (2006.01) |
| *H01L 21/00* | (2006.01) |
| *C23C 14/24* | (2006.01) |
| *C23C 14/12* | (2006.01) |
| *C23C 14/04* | (2006.01) |
| *C03C 17/00* | (2006.01) |
| *H01L 51/00* | (2006.01) |
| *H01L 51/56* | (2006.01) |

(52) U.S. Cl.
CPC ............... *C23C 14/12* (2013.01); *C23C 14/243* (2013.01); *H01L 51/001* (2013.01); *H01L 51/0011* (2013.01); *H01L 51/56* (2013.01); *C23C 14/042* (2013.01); *C03C 17/002* (2013.01)
USPC ....... 118/504; 118/213; 438/34; 257/E33.001

(58) Field of Classification Search
USPC .......................................................... 118/504
See application file for complete search history.

(56) References Cited

U.S. PATENT DOCUMENTS

| | | | |
|---|---|---|---|
| 4,687,939 A | * | 8/1987 | Miyauchi et al. .......... 250/492.2 |
| 4,901,667 A | | 2/1990 | Suzuki et al. |
| 5,742,129 A | | 4/1998 | Nagayama et al. |
| 6,045,671 A | | 4/2000 | Wu et al. |
| 6,091,195 A | | 7/2000 | Forrest et al. |

(Continued)

FOREIGN PATENT DOCUMENTS

| | | |
|---|---|---|
| EP | 1 413 644 A2 | 4/2004 |
| EP | 1 418 250 A2 | 5/2004 |

(Continued)

OTHER PUBLICATIONS

KIPO Registration Determination Certificate dated Sep. 28, 2011, for Korean Patent application 10-2009-0052357, 5 pages.

(Continued)

*Primary Examiner* — William F Kraig
*Assistant Examiner* — Khaja Ahmad
(74) *Attorney, Agent, or Firm* — Christie, Parker & Hale, LLP

(57) ABSTRACT

A thin film deposition apparatus that may prevent a patterning slit sheet from sagging and increase a tensile force of the patterning slit sheet, and a method of manufacturing an organic light-emitting display device using the same.

31 Claims, 15 Drawing Sheets

(56) References Cited

U.S. PATENT DOCUMENTS

| | | |
|---|---|---|
| 6,274,198 B1 | 8/2001 | Dautartas |
| 6,280,821 B1 | 8/2001 | Kadunce et al. |
| 6,371,451 B1 | 4/2002 | Choi |
| 6,579,422 B1 | 6/2003 | Kakinuma |
| 6,749,906 B2 | 6/2004 | Van Slyke |
| 6,878,209 B2 | 4/2005 | Himeshima et al. |
| 6,946,783 B2 | 9/2005 | Kim |
| 7,006,202 B2 | 2/2006 | Byun et al. |
| 8,188,476 B2 | 5/2012 | Takagi et al. |
| 8,193,011 B2 | 6/2012 | Kang et al. |
| 2001/0004186 A1* | 6/2001 | Song et al. .............. 313/407 |
| 2001/0006827 A1 | 7/2001 | Yamazaki et al. |
| 2001/0019807 A1 | 9/2001 | Yamada et al. |
| 2001/0026638 A1 | 10/2001 | Sangu et al. |
| 2002/0017245 A1 | 2/2002 | Tsubaki et al. |
| 2002/0036759 A1 | 3/2002 | Ise et al. |
| 2002/0050061 A1 | 5/2002 | Komyoji et al. |
| 2002/0076847 A1 | 6/2002 | Yamada et al. |
| 2002/0168577 A1 | 11/2002 | Yoon |
| 2002/0187253 A1 | 12/2002 | Marcus et al. |
| 2003/0021886 A1 | 1/2003 | Baele |
| 2003/0101932 A1 | 6/2003 | Kang |
| 2003/0101937 A1 | 6/2003 | Van Slyke et al. |
| 2003/0118950 A1 | 6/2003 | Chao et al. |
| 2003/0168013 A1 | 9/2003 | Freeman et al. |
| 2003/0221614 A1 | 12/2003 | Kang et al. |
| 2003/0221620 A1 | 12/2003 | Yamazaki |
| 2003/0232563 A1 | 12/2003 | Kamiyama et al. |
| 2004/0029028 A1 | 2/2004 | Shimizu |
| 2004/0056244 A1 | 3/2004 | Marcus et al. |
| 2004/0086639 A1 | 5/2004 | Grantham et al. |
| 2004/0115338 A1 | 6/2004 | Yoneda |
| 2004/0115342 A1 | 6/2004 | Shigemura |
| 2004/0127066 A1 | 7/2004 | Jung |
| 2004/0134428 A1 | 7/2004 | Sasaki et al. |
| 2004/0142108 A1 | 7/2004 | Atobe et al. |
| 2004/0144321 A1 | 7/2004 | Grace et al. |
| 2004/0183435 A1* | 9/2004 | Ohshita ................... 313/506 |
| 2004/0194702 A1 | 10/2004 | Sasaki et al. |
| 2004/0195530 A1 | 10/2004 | Kwak et al. |
| 2004/0216673 A1 | 11/2004 | Sakata et al. |
| 2005/0016461 A1 | 1/2005 | Klug et al. |
| 2005/0031836 A1* | 2/2005 | Hirai ........................ 428/209 |
| 2005/0037136 A1 | 2/2005 | Yamamoto |
| 2005/0072361 A1 | 4/2005 | Yang et al. |
| 2005/0110400 A1 | 5/2005 | Nakamura |
| 2005/0129489 A1 | 6/2005 | Quan et al. |
| 2005/0153472 A1 | 7/2005 | Yotsuya |
| 2005/0166842 A1 | 8/2005 | Sakamoto |
| 2005/0229848 A1 | 10/2005 | Shinriki et al. |
| 2005/0263074 A1 | 12/2005 | Masuda et al. |
| 2006/0011136 A1 | 1/2006 | Yamazaki et al. |
| 2006/0022590 A1 | 2/2006 | Aziz et al. |
| 2006/0045958 A1 | 3/2006 | Abiko et al. |
| 2006/0090705 A1 | 5/2006 | Kim |
| 2006/0110544 A1 | 5/2006 | Kim et al. |
| 2006/0113907 A1 | 6/2006 | Im et al. |
| 2006/0144325 A1 | 7/2006 | Jung et al. |
| 2006/0152641 A1 | 7/2006 | Brody |
| 2006/0174829 A1 | 8/2006 | An et al. |
| 2006/0205101 A1 | 9/2006 | Lee et al. |
| 2006/0272572 A1* | 12/2006 | Uematsu et al. ........... 117/84 |
| 2006/0280588 A1 | 12/2006 | Blonigan et al. |
| 2007/0022955 A1 | 2/2007 | Bender et al. |
| 2007/0054044 A1* | 3/2007 | Shimosaki et al. ...... 427/248.1 |
| 2007/0077358 A1 | 4/2007 | Jeong et al. |
| 2007/0148337 A1 | 6/2007 | Nichols et al. |
| 2007/0157879 A1 | 7/2007 | Yotsuya |
| 2007/0163497 A1 | 7/2007 | Grace et al. |
| 2007/0178708 A1* | 8/2007 | Ukigaya ................... 438/758 |
| 2007/0190235 A1 | 8/2007 | Yamazaki et al. |
| 2007/0231460 A1 | 10/2007 | Ukigaya |
| 2008/0018236 A1 | 1/2008 | Arai et al. |
| 2008/0038935 A1* | 2/2008 | Baude et al. .............. 438/759 |
| 2008/0100204 A1* | 5/2008 | Kim ........................ 313/504 |
| 2008/0115729 A1* | 5/2008 | Oda et al. .................. 118/726 |
| 2008/0126741 A1 | 5/2008 | Triplett |
| 2008/0129194 A1 | 6/2008 | Abe et al. |
| 2008/0131587 A1 | 6/2008 | Boroson et al. |
| 2008/0145521 A1 | 6/2008 | Guo et al. |
| 2008/0174235 A1 | 7/2008 | Kim et al. |
| 2008/0238294 A1 | 10/2008 | Xu et al. |
| 2009/0017192 A1 | 1/2009 | Matsuura |
| 2009/0208754 A1 | 8/2009 | Chu et al. |
| 2009/0220691 A1 | 9/2009 | Kim |
| 2009/0229524 A1 | 9/2009 | Kim et al. |
| 2009/0232976 A1 | 9/2009 | Yoon et al. |
| 2009/0277386 A1 | 11/2009 | Takagi et al. |
| 2010/0001301 A1 | 1/2010 | Karg et al. |
| 2010/0055810 A1 | 3/2010 | Sung et al. |
| 2010/0086672 A1 | 4/2010 | Von Drasek et al. |
| 2010/0165454 A1 | 7/2010 | Suetsugu et al. |
| 2010/0192856 A1 | 8/2010 | Sung et al. |
| 2010/0196607 A1 | 8/2010 | Carlson et al. |
| 2010/0271602 A1 | 10/2010 | Hanazaki et al. |
| 2010/0297348 A1 | 11/2010 | Lee et al. |
| 2010/0297349 A1 | 11/2010 | Lee et al. |
| 2010/0310768 A1 | 12/2010 | Lee et al. |
| 2010/0330265 A1 | 12/2010 | Lee et al. |
| 2010/0330712 A1 | 12/2010 | Lee et al. |
| 2011/0033619 A1 | 2/2011 | Lee et al. |
| 2011/0033621 A1 | 2/2011 | Lee et al. |
| 2011/0048320 A1 | 3/2011 | Choi et al. |
| 2011/0052791 A1 | 3/2011 | Jo et al. |
| 2011/0052795 A1 | 3/2011 | Choi et al. |
| 2011/0053296 A1 | 3/2011 | Lee et al. |
| 2011/0220019 A1 | 9/2011 | Lee et al. |
| 2012/0009328 A1 | 1/2012 | Ryu et al. |
| 2012/0313251 A1 | 12/2012 | Kato |

FOREIGN PATENT DOCUMENTS

| | | |
|---|---|---|
| EP | 1 518 940 A1 | 3/2005 |
| JP | 57-194252 A2 | 11/1982 |
| JP | 04-272170 | 9/1992 |
| JP | 5-230628 A2 | 9/1993 |
| JP | 8-27568 A2 | 1/1996 |
| JP | 995776 A2 | 4/1997 |
| JP | 2000-068054 | 3/2000 |
| JP | 2001-052862 | 2/2001 |
| JP | 2001-093667 | 4/2001 |
| JP | 2002-075638 | 3/2002 |
| JP | 2002-175878 | 6/2002 |
| JP | 2003-003250 | 1/2003 |
| JP | 2003-077662 | 3/2003 |
| JP | 2003-157973 | 5/2003 |
| JP | 2003-197531 A2 | 7/2003 |
| JP | 2003-297562 | 10/2003 |
| JP | 2003-321767 | 11/2003 |
| JP | 2004-35964 A2 | 2/2004 |
| JP | 2004-043898 | 2/2004 |
| JP | 200476150 A2 | 3/2004 |
| JP | 2004-103269 | 4/2004 |
| JP | 2004-103341 | 4/2004 |
| JP | 2004137583 A2 | 5/2004 |
| JP | 2004-169169 | 6/2004 |
| JP | 2004-199919 | 7/2004 |
| JP | 2004-349101 | 12/2004 |
| JP | 2005-044592 | 2/2005 |
| JP | 2005-122980 | 5/2005 |
| JP | 2005-165015 A2 | 6/2005 |
| JP | 2005-174843 | 6/2005 |
| JP | 2005-206939 A2 | 8/2005 |
| JP | 2005-235568 | 9/2005 |
| JP | 2005-293968 | 10/2005 |
| JP | 2005-296737 | 10/2005 |
| JP | 2006-28583 A2 | 2/2006 |
| JP | 2006-172930 A2 | 6/2006 |
| JP | 2006-176809 A2 | 7/2006 |
| JP | 2006-210038 | 8/2006 |
| JP | 2006-275433 | 10/2006 |
| JP | 2006-292955 A2 | 10/2006 |
| JP | 2007-047293 | 2/2007 |
| JP | 2007-186740 | 7/2007 |

(56) References Cited

FOREIGN PATENT DOCUMENTS

| | | |
|---|---|---|
| JP | 2007-291506 A2 | 11/2007 |
| JP | 2008-108628 | 5/2008 |
| JP | 2008-121098 | 5/2008 |
| JP | 2008-521165 | 6/2008 |
| JP | 2009-019243 | 1/2009 |
| JP | 2009-24208 A2 | 2/2009 |
| JP | 2009-81165 A2 | 4/2009 |
| JP | 2009-87910 | 4/2009 |
| JP | 2010-261081 A2 | 11/2010 |
| KR | 10-0257219 B1 | 2/2000 |
| KR | 10-2000-0019254 | 4/2000 |
| KR | 10-2000-0023929 | 5/2000 |
| KR | 10-2001-0024652 | 3/2001 |
| KR | 10-2001-0059939 | 7/2001 |
| KR | 10-2001-0092914 A | 10/2001 |
| KR | 2001-0093666 A | 10/2001 |
| KR | 20-0257218 Y1 | 12/2001 |
| KR | 10-2002-0000201 | 1/2002 |
| KR | 10-2002-0001555 | 1/2002 |
| KR | 10-2002-0050922 | 6/2002 |
| KR | 10-2002-0090934 | 12/2002 |
| KR | 10-2003-0001745 | 1/2003 |
| KR | 2003-0034730 A | 5/2003 |
| KR | 10-2003-0046090 | 6/2003 |
| KR | 2003-0069684 | 8/2003 |
| KR | 10-0405080 B1 | 11/2003 |
| KR | 10-2003-0091947 | 12/2003 |
| KR | 10-2003-0093959 | 12/2003 |
| KR | 2003-0094033 A | 12/2003 |
| KR | 10-2004-0014258 A | 2/2004 |
| KR | 10-2004-0034537 | 4/2004 |
| KR | 10-2004-0050045 | 6/2004 |
| KR | 10-2004-0069281 | 8/2004 |
| KR | 10-2004-0084747 | 10/2004 |
| KR | 10-2004-0087142 A | 10/2004 |
| KR | 10-0463212 B1 | 12/2004 |
| KR | 10-2005-0062853 | 6/2005 |
| KR | 10-0520159 B1 | 10/2005 |
| KR | 10-2006-0008602 | 1/2006 |
| KR | 10-2006-0018745 | 3/2006 |
| KR | 2006-0020050 | 3/2006 |
| KR | 10-2006-0056706 | 5/2006 |
| KR | 10-2006-0058459 | 5/2006 |
| KR | 10-2006-0065978 | 6/2006 |
| KR | 10-2006-0073367 | 6/2006 |
| KR | 2006-0049050 | 6/2006 |
| KR | 2006-0059068 | 6/2006 |
| KR | 10-2006-0080475 | 7/2006 |
| KR | 10-2006-0080481 | 7/2006 |
| KR | 10-2006-0080482 | 7/2006 |
| KR | 10-2006-0083510 | 7/2006 |
| KR | 10-2006-0092387 | 8/2006 |
| KR | 10-2006-0098755 | 9/2006 |
| KR | 10-2006-0104288 A | 10/2006 |
| KR | 10-2006-0104675 | 10/2006 |
| KR | 10-2006-0104677 | 10/2006 |
| KR | 10-2006-0109627 | 10/2006 |
| KR | 10-0635903 B1 | 10/2006 |
| KR | 10-2006-0114462 A | 11/2006 |
| KR | 10-0645719 BI | 11/2006 |
| KR | 10-0646160 B1 | 11/2006 |
| KR | 10-2006-0123944 | 12/2006 |
| KR | 10-0687007 B1 | 2/2007 |
| KR | 10-0696547 B1 | 3/2007 |
| KR | 10-0696550 B1 | 3/2007 |
| KR | 10-0697663 BI | 3/2007 |
| KR | 10-0698033 BI | 3/2007 |
| KR | 10-0700466 B1 | 3/2007 |
| KR | 10-2007-0035796 | 4/2007 |
| KR | 10-0711885 B1 | 4/2007 |
| KR | 10-2007-0050793 | 5/2007 |
| KR | 10-0723627 B1 | 5/2007 |
| KR | 10-0726132 B1 | 6/2007 |
| KR | 10-0739309 B1 | 7/2007 |
| KR | 10-2007-0078713 | 8/2007 |
| KR | 10-2007-0080635 | 8/2007 |
| KR | 10-2007-0097218 | 10/2007 |
| KR | 10-2007-0101842 | 10/2007 |
| KR | 10-2007-0105595 | 10/2007 |
| KR | 10-0770653 B1 | 10/2007 |
| KR | 10-2007-0112668 | 11/2007 |
| KR | 10-0787457 B1 | 12/2007 |
| KR | 10-2008-0001184 | 1/2008 |
| KR | 10-2008-0003720 A | 1/2008 |
| KR | 10-0797787 B1 | 1/2008 |
| KR | 10-0800125 B1 | 1/2008 |
| KR | 10-0815265 B1 | 3/2008 |
| KR | 10-2008-0036983 A | 4/2008 |
| KR | 10-0823508 B1 | 4/2008 |
| KR | 10-2008-0044775 | 5/2008 |
| KR | 10-0827760 B1 | 5/2008 |
| KR | 10-2008-0048653 | 6/2008 |
| KR | 10-2008-0055124 A | 6/2008 |
| KR | 10-0839380 B1 | 6/2008 |
| KR | 10-2008-0060400 | 7/2008 |
| KR | 10-2008-0061132 | 7/2008 |
| KR | 10-2008-0061666 A | 7/2008 |
| KR | 10-2008-0061774 A | 7/2008 |
| KR | 10-2008-0062212 | 7/2008 |
| KR | 10-2008-0109559 | 12/2008 |
| KR | 10-0889872 B1 | 3/2009 |
| KR | 10-2009-0038733 | 4/2009 |
| KR | 10-2009-0040618 | 4/2009 |
| KR | 10-2009-0052155 | 5/2009 |
| KR | 10-2009-0053417 | 5/2009 |
| KR | 10-2009-0066996 A | 6/2009 |
| KR | 10-0908232 B1 | 7/2009 |
| KR | 10-2009-0093161 | 9/2009 |
| KR | 10-2009-0097453 | 9/2009 |
| KR | 10-2010-0000128 | 1/2010 |
| KR | 10-2010-0000129 | 1/2010 |
| KR | 10-2010-0026655 | 3/2010 |
| KR | 10-2010-0047796 | 5/2010 |
| KR | 10-2010-0090070 | 8/2010 |
| KR | 10-2010-0099806 A | 9/2010 |
| KR | 10-2010-0126125 A | 12/2010 |
| KR | 10-2011-0101767 | 9/2011 |
| KR | 10-2012-0006324 A | 1/2012 |
| WO | WO 99/25894 | 5/1999 |
| WO | 2008004792 A1 | 1/2008 |

OTHER PUBLICATIONS

KIPO Registration Determination Certificate dated Nov. 25, 2011, for Korean Patent application 10-2010-0014277, 5 pages.
KIPO Office action dated Feb. 1, 2012, for Korean Patent application 10-2010-0011196, 4 pages.
KIPO Office action Feb. 1, 2012, for Korean Patent application 10-2010-0013848.
KIPO Registration Determination CertificateOffice action dated Jan. 13, 2012, for Korean Patent application 10-2009-0056529, 5 pages.
Patent Abstracts of Japan, and English machine translation of Japanese Publication 2001-052862, 20 pages.
Patent Abstracts of Japan, and English machine translation of Japanese Publication 2003-003250, 25 pages.
Korean Patent Abstracts, Publication No. 1020020086047, dated Nov. 18, 2002, for corresponding Korean Patent 10-0405080 listed above.
Korean Patent Abstracts, Publication No. 1020020088662, dated Nov. 29, 2002, for corresponding Korean Patent 10-0463212 listed above.
Korean Patent Abstracts, Publication No. 1020050045619, dated May 17, 2005, for corresponding Korean Patent 10-0520159 listed above.
Korean Patent Abstracts, Publication No. 1020040062203, dated Jul. 7, 2002, for corresponding Korean Patent 10-0646160 listed above.
Korean Patent Abstracts, Publication No. 1020060101987, dated Sep. 27, 2006, for corresponding Korean Patent 10-0687007 listed above.
Korean Patent Abstracts, Publication No. 1020020056238, dated Jul. 10, 2002, for corresponding Korean Patent 10-0698033 listed above.

(56) References Cited

OTHER PUBLICATIONS

Korean Patent Abstracts, Publication No. 1020050078637, dated Aug. 5, 2005, for corresponding Korean Patent 10-0700466 listed above.
Korean Patent Abstracts, Publication No. 1020070025164, dated Mar. 8, 2007, for corresponding Korean Patent 10-0711885 listed above.
Korean Patent Abstracts, Publication No. 1020020034272, dated May 9, 2002, for corresponding Korean Patent 10-0726132 listed above.
Korean Patent Abstracts, Publication No. 1020060126267, dated Dec. 6, 2006, for corresponding Korean Patent 10-0797787 listed above.
English Abstract, Publication No. 1020080002189, dated Jan. 4, 2008, for corresponding Korean Patent 10-0800125 listed above.
Korean Patent Abstracts, Publication No. 1020070050793. dated May 16, 2007, for corresponding Korean Patent 10-0815265 listed above.
Korean Patent Abstracts, Publication No. 1020010062735, dated Jul. 7, 2001, for corresponding Korean Patent 10-0827760 listed above.
Korean Patent Abstracts, Publication No. 1020080038650, dated May 7, 2008, for corresponding Korean Patent 10-0839380 listed above.
KIPO Registration Determination Certificate dated Jul. 20, 2012, for Korean priority Patent application 10-2010-0003545, (5 pages).
KIPO Registration Determination Certificate dated Apr. 30, 2012, for Korean priority Patent application 10-2010-0066992, (5 pages).
Japanese Office action dated Aug. 21, 2012, for Japanese Patent application 2010-145075, (5 pages).
KIPO Office action dated Sep. 1, 2012, for Korean Patent application 10-2010-0010136, (5 pages).
KIPO Notice of Allowance dated Sep. 1, 2012, for Korean Patent application 10-2010-0013848, (5 pages).
KIPO Notice of Allowance dated Sep. 1, 2012, for Korean Patent application 10-2010-0009160, (5 pages).
Japanese Office action dated Sep. 4, 2012, for Japanese Patent application 2010-152846, (4 pages).
KIPO Notice of Allowance dated Aug. 24, 2012, issued to KR 10-2010-0066993 (5 pages).
KIPO Notice of Allowance dated Oct. 31, 2011, for Korean Patent application 10-2010-0014273, ( 5 pages).
KIPO Notice of Allowance, dated Sep. 1, 2012, issued to KR 10-2010-0014276 (5 pages).
KIPO Office action dated Apr. 2, 2012, issued to KR 10-2010-0066993 (4 pages).
KIPO Office action dated Aug. 1, 2011, issued to KR 10-2009-0074001 (3 pages).
KIPO Office Action dated Aug. 28,2012, issued to KR 10-2010-0014274, (5 pages).
KIPO Office action dated Feb. 1, 2012, issued to KR 10-2010-0014272 (4 pages).
KIPO Office Action dated Feb. 6, 2012, issued to KR 10-2010-0014274 (9 pages).
KIPO Office Action dated Feb. 6, 2012, issued to KR 10-2010-0021835 (4 pages).
U.S. Office action dated Apr. 1, 2013, issued to U.S. Appl. No. 12/784,774 (44 pages).
U.S. Office action dated Aug. 7, 2013, issued to U.S. Appl. No. 13/015,357, (30 pages).
U.S. Office action dated Dec. 17, 2012, issued to U.S. Appl. No. 12/873,556 (37 pages).
U.S. Office action dated Dec. 26, 2012, issued to U.S. Appl. No. 12/815,673 (21 pages).
U.S. Office action dated Jan. 25, 2013, issued to U.S. Appl. No. 13/015,357 (21 pages).
U.S. Office action dated Jul. 5, 2013, issued to U.S. Appl. No. 12/873,556, (17 pages).
U.S. Office action dated Jul. 3, 2013 in U.S. Appl. No. 12/873,689 (48 pages).
U.S. Office action dated May 24, 2013, issued to U.S. Appl. No. 12/849,092 (31 pages).
U.S. Office action dated Nov. 22, 2013, issued to U.S. Appl. No. 13/198,591, (28 pages).
U.S. Office action dated Oct. 1, 2013, issued to U.S. Appl. No. 12/849,092, (13 pages).
US Office action dated Sep. 12, 2012, in U.S. Appl. No. 12/515,673 (26 pages).
US Office action dated Sep. 20, 2013, in U.S. Appl. No. 13/014,225, (33 pages).
English machine translation of Japanese Publication 2004-349101 previously filed in an IDS dated Oct. 22, 2012, (10 pages).
U.S. Office action dated Dec. 20, 2012 for cross reference U.S. Appl. No. 12/984,289, (20 pages).
U.S. Office action dated Feb. 26, 2013 for cross reference U.S. Appl. No. 12/794,093, (31 pages).
U.S. Notice of Allowance dated Mar. 18, 2013 for cross reference U.S. Appl. No. 12/795,001, (29 pages).
U.S. Office action dated Mar. 15, 2013 for cross reference U.S. Appl. No. 12/813,786, (33 pages).
U.S. Office action dated Mar. 22, 2013 for cross reference U.S. Appl. No. 12/987,569, (12 pages).
U.S. Office action dated Mar. 18 2013 for cross reference U.S. Appl. No. 12/984,231, (29 pages).
U.S. Office action dated May 7 2013 for cross reference U.S. Appl. No. 12/820,270, (37 pages).
U.S. Office action dated Jun. 11, 2013 for cross reference U.S. Appl. No. 12/862,125, (37 pages).
U.S. Office action dated Jun. 26, 2013 for cross reference U.S. Appl. No. 12/794,093, (20 pages).
U.S. Office action dated Jul. 17, 2013 for cross reference U.S. Appl. No. 12/984,231, (18 pages).
U.S. Office action dated Oct. 11, 2013 for cross reference U.S. Appl. No. 12/907,396, (44 pages).
U.S. Office action dated Oct. 21, 2013 for cross reference U.S. Appl. No. 12/987,569, (14 pages).

* cited by examiner

THIN FILM DEPOSITION APPARATUS INCLUDING PATTERNING SLIT SHEET AND METHOD OF MANUFACTURING ORGANIC LIGHT-EMITTING DISPLAY DEVICE WITH THE SAME

CROSS-REFERENCE TO RELATED PATENT APPLICATION

This application claims priority to and the benefit of Korean Patent Application No. 10-2010-0074382, filed on Jul. 30, 2010, in the Korean Intellectual Property Office, the disclosure of which is incorporated herein in its entirety by reference.

BACKGROUND

1. Field

One or more aspects of embodiments according to the present invention relate to a thin film deposition apparatus and a method of manufacturing an organic light-emitting display device with the same.

2. Description of Related Art

Organic light-emitting display devices have a larger viewing angle, better contrast characteristics, and a faster response speed than other display devices, and thus have drawn attention as a next-generation display device.

An organic light-emitting display device includes intermediate layers, including an emission layer disposed between a first electrode and a second electrode that are arranged opposite to each other. The electrodes and the intermediate layers may be formed via various methods, one of which is a deposition method. When an organic light-emitting display device is manufactured by using the deposition method, a fine metal mask (FMM) having the same pattern as a thin film to be formed is arranged to closely contact a substrate, and a thin film material is deposited over the FMM in order to form the thin film having a desired pattern.

However, the deposition method using such an FMM is not suitable for manufacturing larger devices using a mother glass having a size of 5 G or greater. In other words, when such a large mask is used, the mask may bend due to its own weight, thereby distorting a pattern. This is not conducive for manufacturing large screen display devices in view of the recent trend towards high-definition patterns.

SUMMARY

In order to address the drawback of the deposition method using a fine metal mask (FMM), embodiments of the present invention provide a thin film deposition apparatus that may prevent a patterning slit sheet from sagging, and a method of manufacturing an organic light-emitting display device with the thin film deposition apparatus.

According to an aspect of embodiments of the present invention, there is provided a thin film deposition apparatus for forming a thin film on a substrate. The apparatus includes a deposition source configured to discharge a deposition material; a deposition source nozzle unit located at a side of the deposition source and comprising a plurality of deposition source nozzles arranged in a first direction; a patterning slit sheet located opposite to the deposition source nozzle unit and having a plurality of patterning slits arranged in a second direction perpendicular to the first direction; and a supporting portion that supports the patterning slit sheet. Deposition is performed while the substrate is moved relative to the thin film deposition apparatus in the first direction. The supporting portion may prevent the patterning slit sheet from sagging toward the deposition source.

The deposition source, the deposition source nozzle unit, and the patterning slit sheet may be integrally formed as one body.

The deposition source and the deposition source nozzle unit, and the patterning slit sheet may be integrally connected as one body by connection units that guide movement of the deposition material.

The connection units may be formed to seal a space between the deposition source, the deposition source nozzle unit, and the patterning slit sheet.

The plurality of deposition source nozzles may be tilted at an angle.

The plurality of deposition source nozzles may include deposition source nozzles arranged in two rows formed in the first direction, and the deposition source nozzles in the two rows are tilted to face each other.

The plurality of deposition source nozzles may include deposition source nozzles arranged in two rows formed in the first direction, the deposition source nozzles of one of the two rows located at a first side of the patterning slit sheet are arranged to face a second side of the patterning slit sheet, and the deposition source nozzles of the other one of the two rows located at the second side of the patterning slit sheet are arranged to face the first side of the patterning slit sheet.

The supporting portion may cross a length direction of the patterning slits.

The supporting portion may be arranged perpendicularly to the length direction of the patterning slits.

The supporting portion may cross two or more neighboring patterning slits so as to support the patterning slit sheet.

A plurality of the supporting portions may be formed.

The supporting portions located adjacent to each other may not be arranged on a line extending in a length direction of the supporting portions.

The supporting portions may divide one patterning slit into two or more regions.

An arrangement of the supporting portions located on one of the plurality of patterning slits may be different from an arrangement of the supporting portions located on other patterning slits adjacent to the patterning slit.

The plurality of supporting portions may extend in the second direction and may be separated from each other in the first direction.

The supporting portions may be arranged at equal intervals.

Each of the patterning slits may be divided into a plurality of patterning openings by the supporting portions, and may include a reinforcing member that connects vertices facing each other in the patterning opening to each other.

According to another aspect of embodiments of the present invention, there is provided a thin film deposition apparatus for forming a thin film on a substrate, the apparatus including a deposition source configured to discharge a deposition material; a deposition source nozzle unit located at a side of the deposition source and including a plurality of deposition source nozzles arranged in a first direction; a patterning slit sheet located opposite to the deposition source nozzle unit and having a plurality of patterning slits arranged in the first direction; a barrier plate assembly including a plurality of barrier plates that are located between the deposition source nozzle unit and the patterning slit sheet in the first direction, and that partition a space between the deposition source nozzle unit and the patterning slit sheet into a plurality of sub-deposition spaces; and a supporting portion that supports the patterning slit sheet, wherein the thin film deposition apparatus and the substrate are spaced apart from each other, and the thin film deposition apparatus or the substrate is movable relative to the other during deposition. The supporting portion may prevent the patterning slit sheet from sagging toward the deposition source.

The plurality of barrier plates may extend in a second direction substantially perpendicular to the first direction.

The barrier plate apparatus may include a first barrier plate apparatus including a plurality of first barrier plates, and a second barrier plate apparatus including a plurality of second barrier plates.

The plurality of first barrier plates and the plurality of second barrier plates may extend in the second direction substantially perpendicular to the first direction.

The plurality of first barrier plates may be arranged to respectively correspond to the plurality of second barrier plates.

The deposition source may be spaced apart from the barrier plate assembly.

The barrier plate assembly may be spaced apart from the patterning slit sheet.

The supporting portion may cross a length direction of the patterning slits.

The supporting portion may be arranged perpendicularly to the length direction of the patterning slits.

The supporting portion may cross two or more neighboring patterning slits so as to support the patterning slit sheet.

A plurality of the supporting portions may be formed.

The supporting portions located adjacent to each other may not be arranged on a line extending in a length direction of the supporting portions.

The supporting portions may divide one patterning slit into two or more regions.

An arrangement of the supporting portions located at one of the patterning slits may be different from an arrangement of the supporting portions located at other patterning slits adjacent to the one of the patterning slits.

The plurality of supporting portions may extend in the second direction and may be separated from each other in the first direction.

The supporting portions may be arranged at equal intervals.

Each of the patterning slits may be divided into a plurality of patterning openings by the supporting portions, and may include a reinforcing member that connects vertices facing each other in the patterning opening to each other.

According to another aspect of embodiments of the present invention, there is provided a method of manufacturing an organic light-emitting display device with a thin film deposition apparatus for forming a thin film on a substrate, the method including the operations of arranging the substrate to be spaced from the thin film deposition apparatus; and depositing a deposition material discharged from the thin film deposition apparatus onto the substrate while the thin film deposition apparatus or the substrate is moved relative to the other.

The operation of depositing the deposition material on the substrate may include the operation of continuously depositing the deposition material discharged from the thin film deposition apparatus on the substrate while the substrate is moved relative to the thin film deposition apparatus.

BRIEF DESCRIPTION OF THE DRAWINGS

The above and other features and aspects of the present invention will become more apparent by describing in detail exemplary embodiments thereof with reference to the attached drawings in which.

DETAILED DESCRIPTION OF THE EMBODIMENTS

Figure 1:
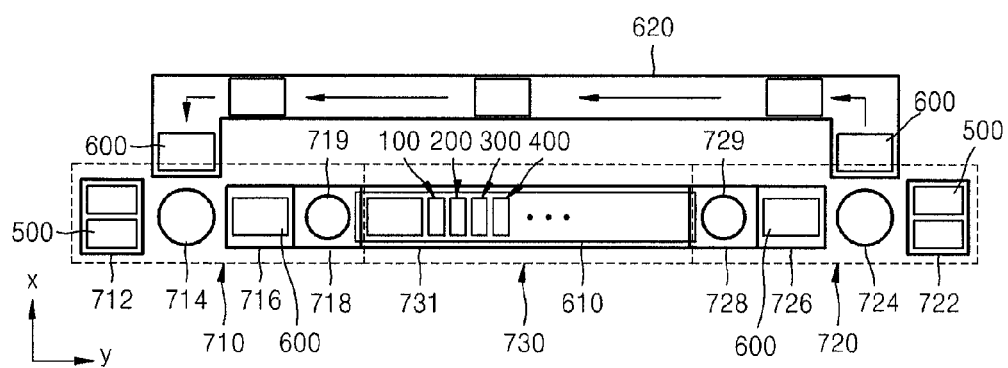
FIG. 1 illustrates a thin film deposition system that includes a thin film deposition apparatus, according to an embodiment of the present invention.

Hereinafter, exemplary embodiments of the present invention will now be described more fully with reference to the accompanying drawings. In the drawings, the thicknesses of layers and regions are exaggerated for clarity. Like reference numerals in the drawings denote like elements, and thus redundant descriptions may be omitted.

Figure 2:
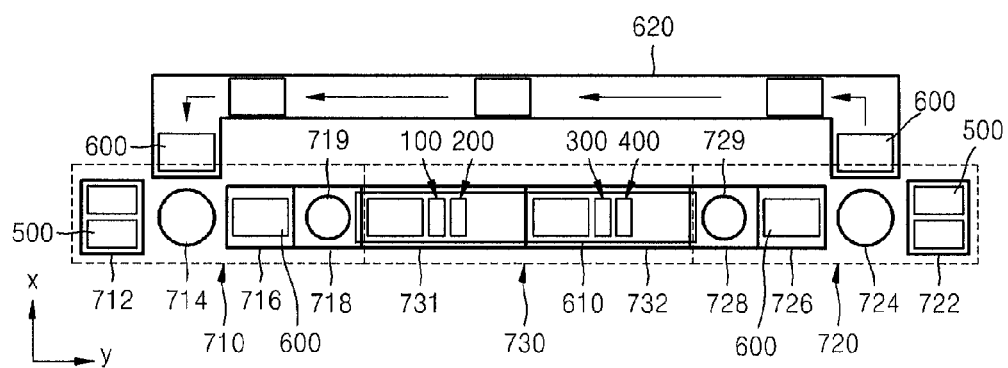
FIG. 2 illustrates a modified example of the thin film deposition system of FIG. 1.
Figure 3:
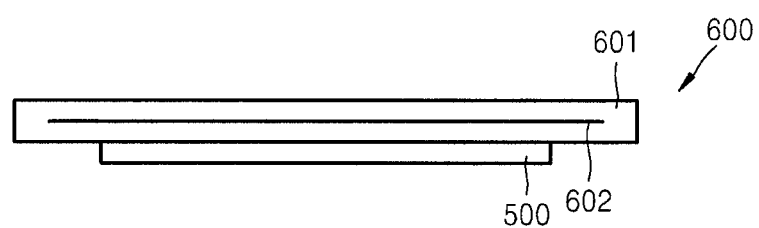
FIG. 3 is a schematic diagram of an example of an electrostatic chuck.

FIG. 1 is a schematic block diagram of a thin film deposition system according to an embodiment of the present invention. FIG. 2 illustrates a modified example of the thin film deposition system of FIG. 1. FIG. 3 is a schematic diagram of an example of an electrostatic chuck 600 included in the thin film deposition system of FIG. 1.

Referring to FIG. 1, the thin film deposition system includes a loading unit 710, a deposition unit 730, an unloading unit 720, a first conveyer unit 610, and a second conveyer unit 620.

The loading unit 710 may include a first rack 712, a transport robot 714, a transport chamber 716, and a first inversion chamber 718.

A plurality of substrates 500 onto which a deposition material is not applied are stacked up on the first rack 712. The transport robot 714 picks up one of the substrates 500 from the first rack 712, places it on the electrostatic chuck 600 transferred by the second conveyor unit 620, and moves the electrostatic chuck 600 having the substrate 500 thereon into the transport chamber 716.

The first inversion chamber 718 is located adjacent to the transport chamber 716. The first inversion chamber 718 includes a first inversion robot 719 that inverts the electrostatic chuck 600 and then loads it into the first conveyer unit 610 of the deposition unit 730.

Referring to FIG. 3, the electrostatic chuck 600 may include an electrode 602 embedded in a main body 601 formed of ceramic, wherein the electrode 602 is supplied with power. The substrate 500 is attached to a surface of the main body 601 when a high voltage is applied to the electrode 602.

Referring back to FIG. 1, the transport robot 714 places one of the substrates 500 on the surface of the electrostatic chuck 600, and the electrostatic chuck 600 having the substrate 500 thereon is loaded into the transport chamber 716. The first inversion robot 719 inverts the electrostatic chuck 600 so that the substrate 500 is turned upside down in the deposition unit 730.

The unloading unit 720 is constituted to operate in an opposite manner to the loading unit 710 described above. Specifically, a second inversion robot 729 in a second inversion chamber 728 inverts the electrostatic chuck 600 having the substrate 500 thereon, which has passed through the deposition unit 730, and then moves the electrostatic chuck 600 having the substrate 500 thereon into an ejection chamber 726. Then, an ejection robot 724 removes the electrostatic chuck 600 having the substrate 500 thereon from the ejection chamber 726, separates the substrate 500 from the electrostatic chuck 600, and then loads the substrate 500 onto a second rack 722. The electrostatic chuck 600 separated from the substrate 500 is returned back into the loading unit 710 via the second conveyer unit 620.

However, the present invention is not limited to the above description. For example, when placing the substrate 500 on the electrostatic chuck 600, the substrate 500 may be fixed onto a bottom surface of the electrostatic chuck 600 and then moved into the deposition unit 730. In this case, for example, the first inversion chamber 718 and the first inversion robot 719, and the second inversion chamber 728 and the second inversion robot 729, would not be required.

The deposition unit 730 may include at least one deposition chamber. Referring to FIG. 1, the deposition unit 730 may include a first chamber 731, in which first to fourth thin film deposition apparatuses 100, 200, 300, and 400 are located. Although FIG. 1 illustrates that a total of four thin film deposition apparatuses, i.e., the first to fourth thin film deposition apparatuses 100 to 400, are installed in the first chamber 731, the total number of thin film deposition apparatuses that are to be installed in the first chamber 731 may vary according to a deposition material and deposition conditions. The first chamber 731 is maintained in a vacuum state during a deposition process.

Referring to FIG. 2, according to another embodiment of the present invention, a deposition unit 730 includes a first chamber 731 and a second chamber 732 that are connected to each other, first and second thin film deposition apparatuses 100 and 200 are located in the first chamber 731, and third and fourth thin film deposition apparatuses 300 and 400 are located in the second chamber 732. In other embodiments, the thin film deposition system may include more than two chambers.

In the embodiment illustrated in FIG. 1, the electrostatic chuck 600 on which the substrate 500 is placed may be moved at least to the deposition unit 730 or may be moved sequentially to the loading unit 710, the deposition unit 730, and the unloading unit 720, by the first conveyor unit 610. The electrostatic chuck 600 that is separated from the substrate 500 in the unloading unit 720 is moved back to the loading unit 710 by the second conveyor unit 620.

Figure 4:
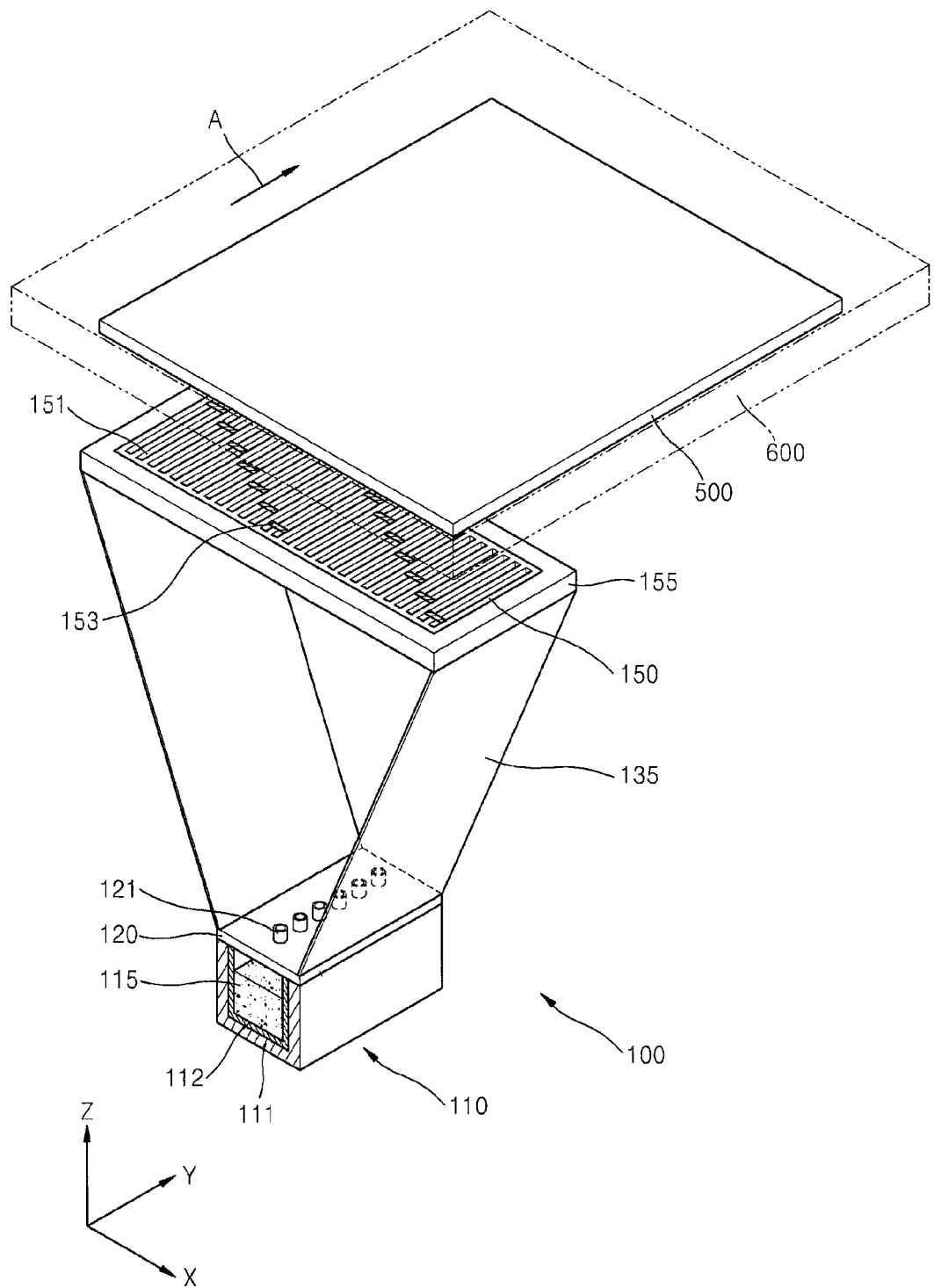
FIG. 4 is a schematic perspective view of a thin film deposition apparatus according to an embodiment of the present invention.
Figure 5:
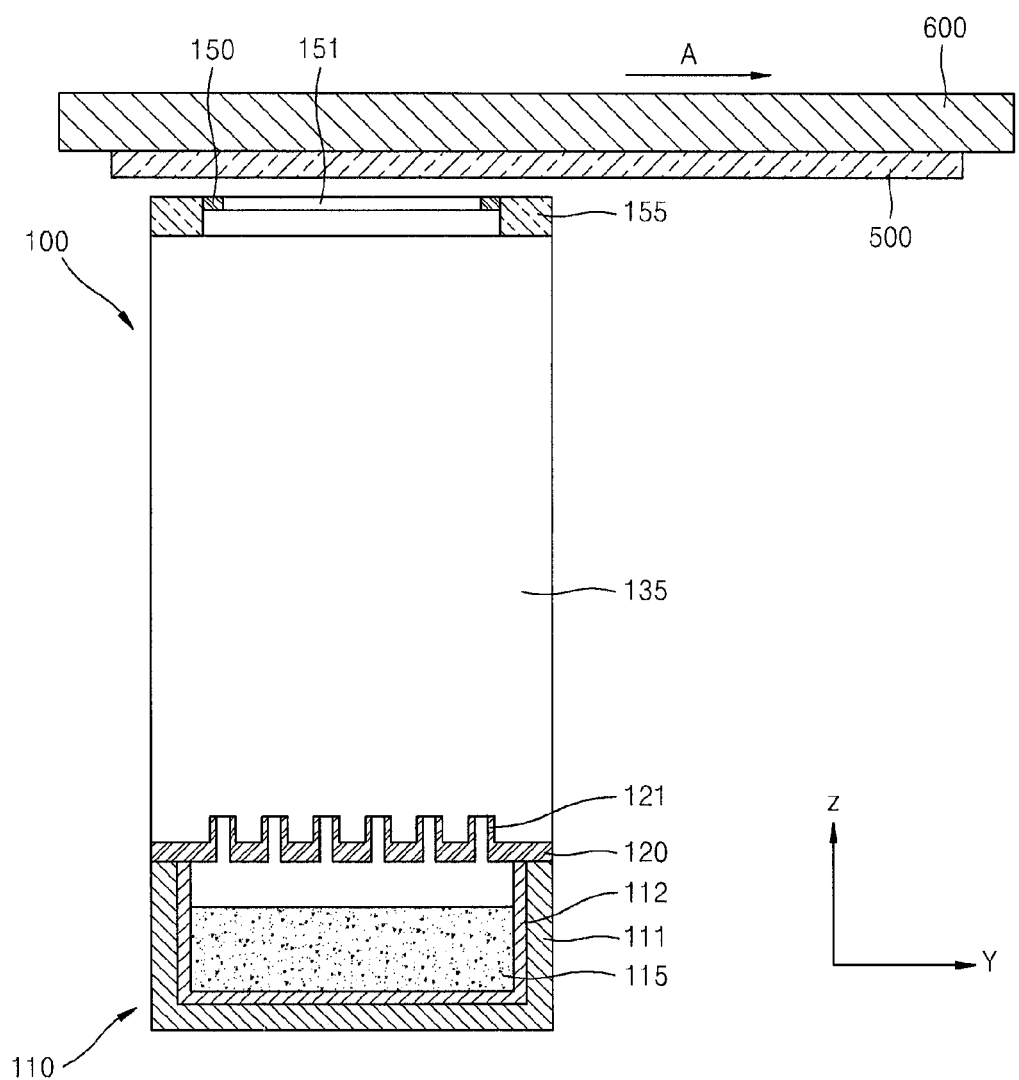
FIG. 5 is a schematic side sectional view of the thin film deposition apparatus of FIG. 4 in a plane parallel to the YZ plane.
Figure 6:
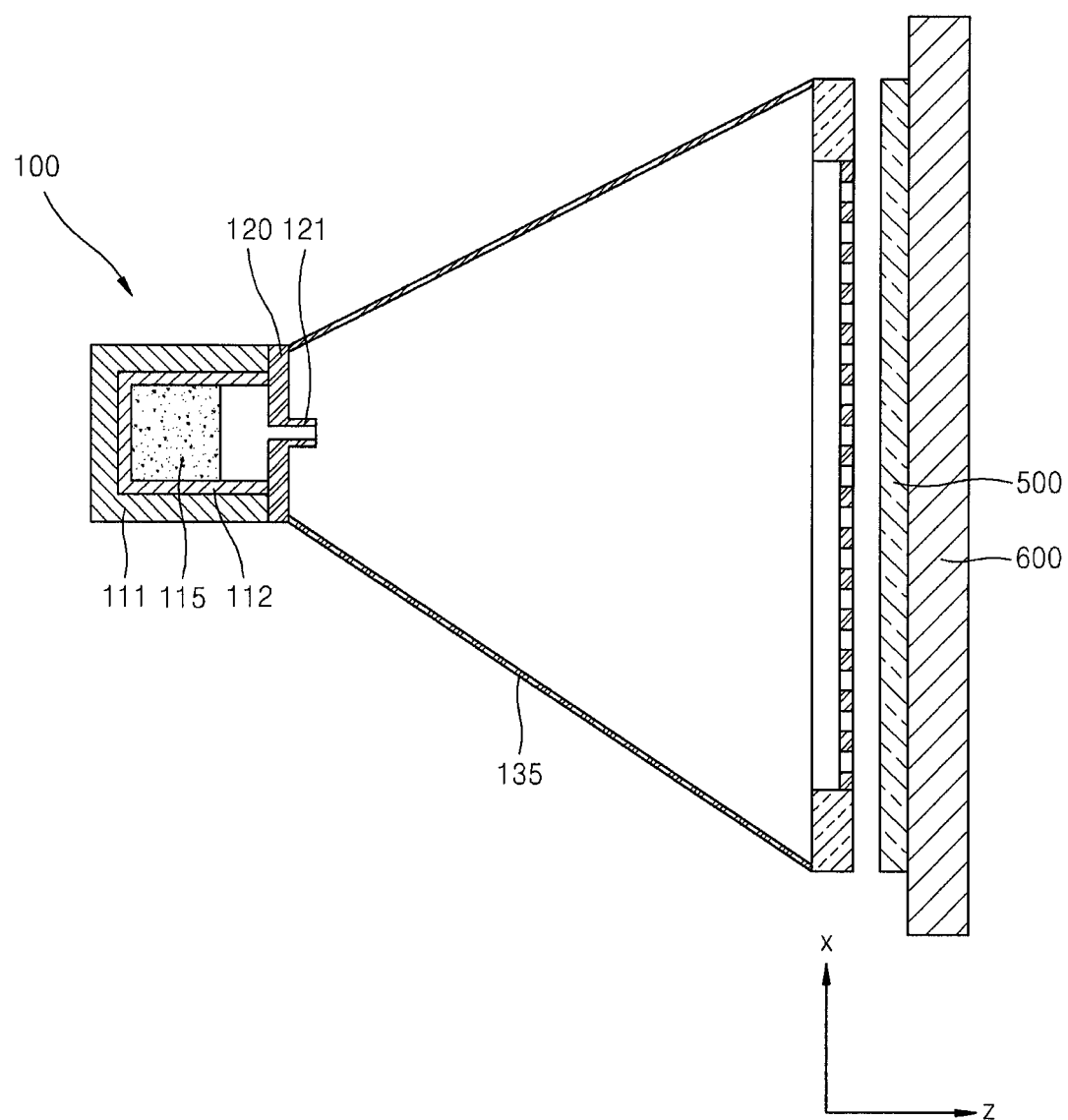
FIG. 6 is a schematic sectional view of the thin film deposition apparatus of FIG. 4 in a plane parallel to the XZ plane, according to an embodiment of the present invention.

FIG. 4 is a schematic perspective view of a thin film deposition apparatus 100 according to an embodiment of the present invention. FIG. 5 is a schematic side sectional view of the thin film deposition apparatus 100 of FIG. 4 in a plane parallel to the YZ plane. FIG. 6 is a schematic sectional view of the thin film deposition apparatus 100 of FIG. 4 in a plane parallel to the XZ plane.

Referring to FIGS. 4 through 6, the thin film deposition apparatus 100 according to the current embodiment includes a deposition source 110, a deposition source nozzle unit 120, and a patterning slit sheet 150.

For example, the first chamber 731 of FIG. 1 should be basically maintained in a high-vacuum state as in a deposition method using a fine metal mask (FMM) so that a deposition material 115 emitted from the deposition source 110 and discharged through the deposition source nozzle unit 120 and the patterning slit sheet 150, may be deposited onto the substrate 500 in a desired pattern. In addition, the temperature of the patterning slit sheet 150 should be sufficiently lower than the temperature of the deposition source 110. In this regard, the temperature of the patterning slit sheet 150 may be about 100° C. or less. The temperature of the patterning slit sheet 150 should be sufficiently low so as to reduce thermal expansion of the patterning slit sheet 150.

The substrate 500 that is a deposition target substrate is located in the first chamber 731. The substrate 500 may be a substrate for flat panel displays. A large substrate, such as a mother glass, for manufacturing a plurality of flat panel displays, may be used as the substrate 500. Other substrates may also be employed.

In the current embodiment, deposition is performed while the substrate 500 is moved relative to the thin film deposition apparatus 100.

For example, in a conventional FMM deposition method, the size of the FMM is equal to the size of a substrate. Thus, the size of the FMM has to be increased as the substrate becomes larger. However, it is neither straightforward to manufacture a large FMM nor to extend an FMM to be accurately aligned with a pattern.

In order to overcome this problem, in the thin film deposition apparatus 100 according to the current embodiment, deposition may be performed while the thin film deposition apparatus 100 or the substrate 500 is moved relative to the other. In other words, deposition may be continuously performed while the substrate 500, which is arranged so as to face the thin film deposition apparatus 100, is moved in a Y-axis direction. For example, deposition may be performed in a scanning manner while the substrate 500 is moved in a direction (first direction) indicated by an arrow A in FIG. 4.

In the thin film deposition apparatus 100 according to the current embodiment, the patterning slit sheet 150 may be smaller (e.g., significantly smaller) than an FMM used in a conventional deposition method. In other words, in the thin film deposition apparatus 100, deposition is continuously performed, i.e., in a scanning manner while the substrate 500 is moved in the Y-axis direction. Thus, lengths of the patterning slit sheet 150 in the X-axis and/or Y-axis directions may be less (e.g., significantly less) than the respective lengths of the substrate 500 in the X-axis and Y-axis directions. As described above, since the patterning slit sheet 150 may be formed to be smaller (e.g., significantly smaller) than the FMM used in the conventional deposition method, it is relatively easy to manufacture the patterning slit sheet 150. In other words, using the patterning slit sheet 150, which is smaller than the FMM used in the conventional deposition method, is more convenient in all processes, including etching and other subsequent processes, such as precise extension, welding, moving, and cleaning processes, compared to the conventional deposition method using the larger FMM, and is more advantageous for a relatively large display device.

The deposition source 110 that contains and heats the deposition material 115 is located at an opposite side of the chamber to a side in which the substrate 500 is located. While being vaporized in the deposition source 110, the deposition material 115 is deposited on the substrate 500.

For example, the deposition source 110 includes a crucible 112 that is filled with the deposition material 115, and a cooling block 111 that heats the crucible 112 to vaporize the deposition material 115 contained in the crucible 112 towards a side of the crucible 112, and in particular, towards the deposition source nozzle unit 120. The cooling block 111 prevents radiation of heat from the crucible 112 to the outside, i.e., into the chamber. The cooling block 111 may include a heater (not shown) that heats the crucible 112.

The deposition source nozzle unit 120 is located at a side of the deposition source 110, and in particular, at the side of the deposition source 110 facing the substrate 500. The deposition source nozzle unit 120 includes a plurality of deposition source nozzles 121 that may be arranged at equal intervals in the Y-axis direction, i.e., a scanning direction of the substrate 500. The deposition material 110 that is vaporized in the deposition source 110 passes through the deposition source nozzle unit 120 towards the substrate 500 that is the deposition target substrate. As described above, when the deposition source nozzle unit 120 includes the plurality of deposition source nozzles 121 arranged in the Y-axis direction, that is, the scanning direction of the substrate 500, the size of a pattern formed of the deposition material 115 discharged through each of a plurality of patterning slits 151 of the patterning slit sheet 150 is affected by the size of one of the deposition source nozzles 121 (since there is only one line of the deposition nozzles 121 in the Y-axis direction). Thus, no shadow zone may be formed on the substrate 500. In addition, because the plurality of deposition source nozzles 121 are arranged in the scanning direction of the substrate 500, even if there is a difference in flux between the deposition source nozzles 121, the difference may be compensated for and deposition uniformity may be maintained constantly.

The patterning slit sheet 150 and a frame 155 are located between the deposition source 110 and the substrate 500. The frame 155 may be formed in a lattice shape, similar to a window frame. The patterning slit sheet 150 is bound inside the frame 955. The patterning slit sheet 150 has a plurality of patterning slits 151 arranged in parallel in the X-axis direction. The deposition material 115 that is vaporized in the deposition source 110 passes through the deposition source nozzle unit 120 and the patterning slit sheet 150 towards the substrate 500. The patterning slit sheet 150 may be manufactured by etching, which is the same method as used in a conventional method of manufacturing an FMM, and in particular, a striped FMM. In this regard, the total number of patterning slits 151 may be greater than the total number of deposition source nozzles 121.

The patterning slit sheet 150 may further include a supporting portion 153 that may prevent the patterning slit sheet 150 from sagging toward the deposition source 110. This will be described later.

The deposition source 110 and the deposition source nozzle unit 120 coupled to the deposition source 110 may be arranged to be separated from the patterning slit sheet 150 (e.g., separated by a predetermined distance). Alternatively, the deposition source 110 and the deposition source nozzle unit 120 coupled to the deposition source 110 may be connected to the patterning slit sheet 150 by first connection units 135. That is, the deposition source 110, the deposition source nozzle unit 120, and the patterning slit sheet 150 may be integrally formed as one body by being connected to each other via the first connection units 135. The first connection units 135 guide the deposition material 115, which is discharged through the deposition source nozzles 121, to move straight and not to flow in the X-axis direction. Referring to FIG. 6, the connection units 135 are formed on left and right sides of the deposition source 110, the deposition source nozzle unit 120, and the patterning slit sheet 150 to guide the deposition material 115 not to flow in the X-axis direction; however, aspects of the present invention are not limited thereto. For example, the connection units 135 may be formed in the form of a sealed box so as to guide the deposition material 115 to not flow in both the X-axis and Y-axis directions.

As described above, the thin film deposition apparatus 100 according to the current embodiment performs deposition while being moved relative to the substrate 500. In order to move the thin film deposition apparatus 100 relative to the substrate 500, the patterning slit sheet 150 is separated (or spaced) from the substrate 500 (e.g., separated by a predetermined distance).

For example, in a conventional deposition method using an FMM, deposition is performed with the FMM in close contact with a substrate in order to prevent formation of a shadow zone on the substrate. However, when the FMM is used in close contact with the substrate, the contact may cause defects. In addition, in the conventional deposition method, the size of the mask has to be the same as the size of the substrate since the mask cannot be moved relative to the substrate. Thus, the size of the mask has to be increased as display devices become larger. However, it is not easy to manufacture such a large mask.

In order to overcome this problem, in the thin film deposition apparatus 100 according to the current embodiment, the patterning slit sheet 150 is arranged to be separated (or spaced) from the substrate 500 (e.g., separated by a predetermined distance).

As described above, according to embodiments of the present invention, a mask is formed to be smaller than a substrate, and deposition is performed while the mask is moved relative to the substrate. Thus, the mask can be easily manufactured. In addition, defects caused due to the contact between a substrate and an FMM, which may occur in the conventional deposition method, may be prevented. Furthermore, since it is unnecessary to place the FMM in close contact with the substrate during a deposition process, the manufacturing time may be reduced.

Figure 7:
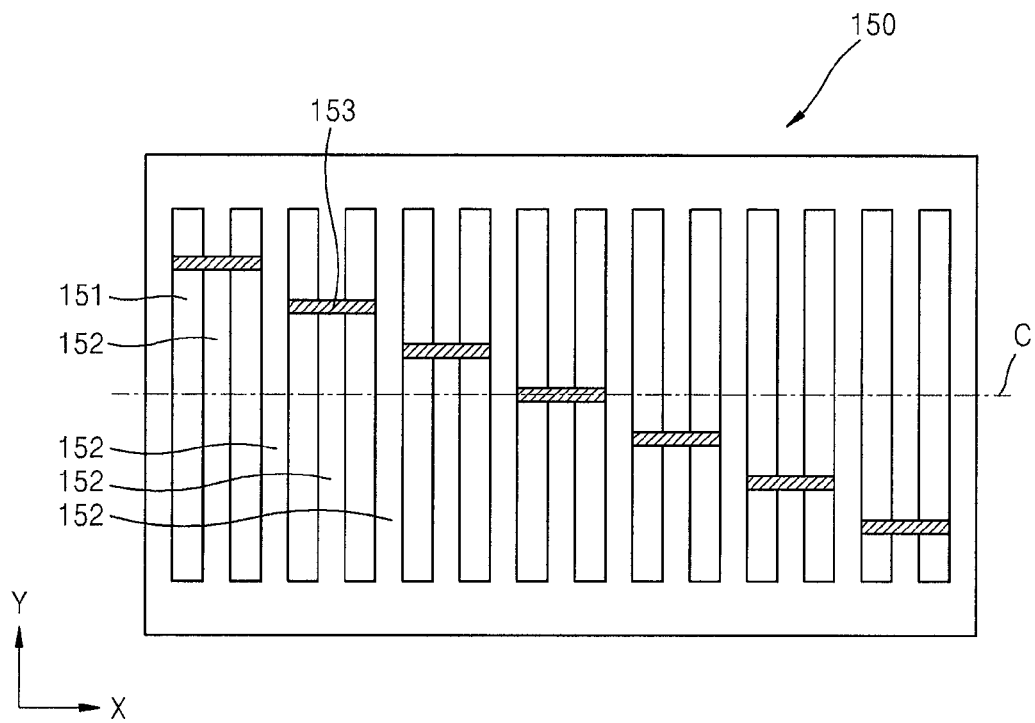
FIG. 7 is a schematic plan view illustrating a modified example of a patterning slit sheet, according to an embodiment of the present invention.

FIG. 7 is a schematic plan view illustrating a modified example of the patterning slit sheet 150, according to an embodiment of the present invention. Referring to FIG. 7, the patterning slit sheet 150 may include patterning slits 151, patterning ribs 152, and the supporting portions 153.

The supporting portions 153 are located on the patterning slit sheet 150 to support the patterning slit sheet 150 so as to prevent the patterning slit sheet 150 from sagging. In more detail, the patterning slits 151 are penetration portions formed in the pattern slit sheet 150 so that the deposition material 115 discharged from the deposition source 110 can be deposited on the substrate 500. The patterning ribs 152 are regions located between neighboring patterning slits 151 to block the deposition material 115. Since the patterning slits 151 and the patterning ribs 152 are formed extending in the first direction (Y-axis direction), when the patterning slit sheet 150 is located on the deposition source 110 as shown in FIG. 4, the patterning slit sheet 150 may sag toward the deposition source 110. The supporting portions 153 are formed crossing the patterning slits 151 to connect two or more neighboring patterning slits 151, and thus, supports the patterning slit sheet 150. That is, the supporting portions 153 are arranged to connect the patterning ribs 152 to each other while crossing the neighboring patterning slits 151. Thus, since the plurality of patterning ribs 152 are connected to each other in a direction across the length direction of the patterning ribs 152 with the supporting portions 153, the patterning ribs 152 are supported and the sagging of the patterning slit sheet 150 is prevented or reduced. The supporting portions 153 may be arranged in a direction (X-axis direction) perpendicular to the length direction (Y-axis direction) of the patterning slits 151.

Each of the supporting portions 153 may connect (e.g., cross) two neighboring patterning slits 151 as shown in FIG. 7. When the supporting portion 153 is connected to (e.g., crosses over) two patterning slits 151, three patterning ribs 152 may be connected to each other with one supporting portion 153. However, the present invention is not limited thereto. In other embodiments, one supporting portion 153 may connect three or more patterning slits 151 to each other. In other words, one supporting portion 153 may cross three or more patterning slits 151.

The plurality of supporting portions 153 may be formed. The supporting portions 153 that are adjacent to each other may not be arranged on a line extending in the length direction of the supporting portions 153. That is, referring to FIG. 7, on an extending line C of the supporting portion 153 located on a center portion of the patterning slit sheet 150, other supporting portions 153 may not be arranged, but may be separated (e.g., spaced) from each other in the Y-axis direction. As described above, since the supporting portions 153 are not arranged on the same line, but are separated from each other in the Y-axis direction, the force (e.g., strength) for supporting the patterning slit sheet 150 may be reinforced.

Figure 8:
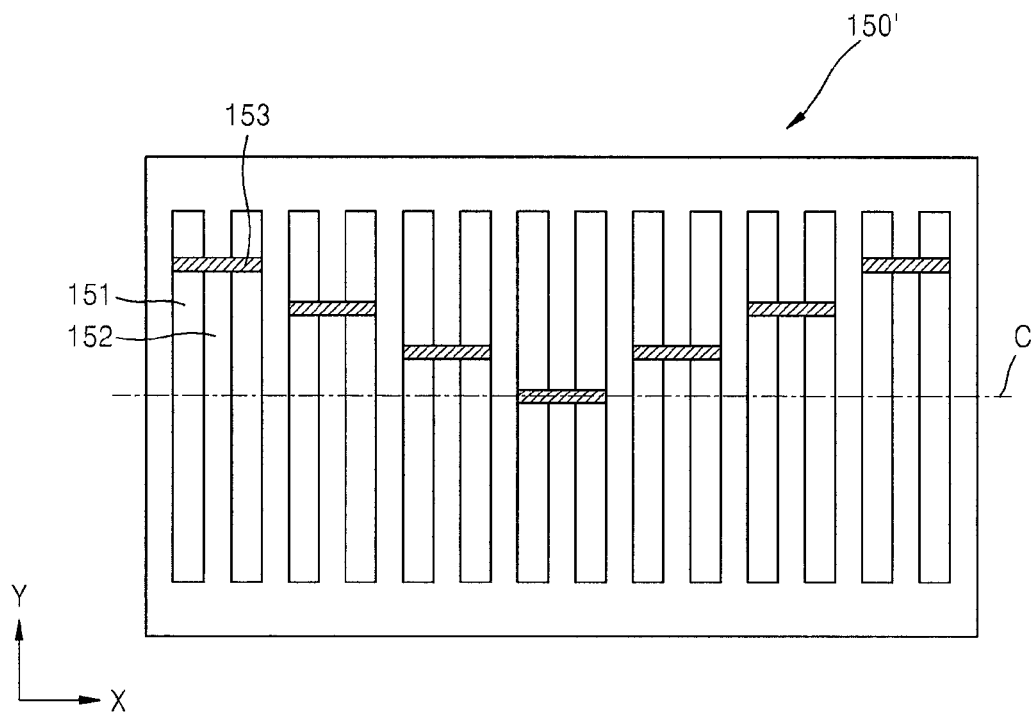
FIG. 8 is a schematic plan view illustrating another modified example of the patterning slit sheet, according to an embodiment of the present invention.

FIG. 8 is a schematic plan view of another modified example of the patterning slit sheet 150', according to an embodiment of the present invention. Referring to FIG. 8, the supporting portions 153 may be located only at an upper portion of a center line C and the center line C of the patterning slit sheet 150'. The center line C of the patterning slit sheet 150' is a line extending from a half portion in a longitudinal length of the patterning slit sheet 150' in a second direction (X-axis direction) that is perpendicular to the first direction (Y-axis direction), and the center portion C is the portion that is most likely to be sagged. The supporting portions 153 may be located at both upper and lower portions of the center line C as shown in FIG. 7, or may be located only at the upper or lower portion of the center line C as shown in FIG. 8.

Figure 9:
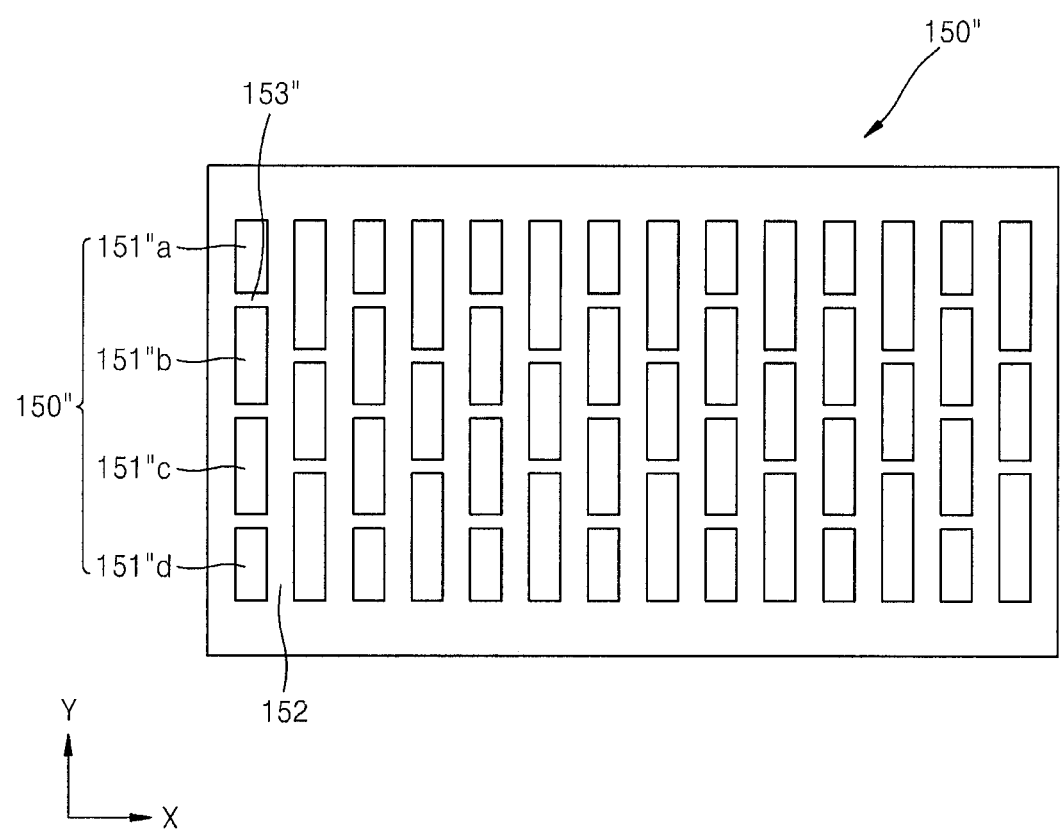
FIG. 9 is a schematic plan view illustrating another modified example of the patterning slit sheet, according to an embodiment of the present invention.

FIG. 9 is a schematic plan view of another modified example of the patterning slit sheet 150", according to an embodiment of the present invention. Referring to FIG. 9, one or more supporting portions 153" are located at each of the patterning slits 151" so as to divide the patterning slit 151" into a plurality of regions 151"a, 151"b, 151"c, and 151"d. That is, unlike the patterning slits sheets 150" shown in FIGS. 7 and 8, in the patterning slit sheet 150" illustrated in FIG. 9, the supporting portions 153" do not connect two or more different patterning slits 151" to each other, and are located in each of the patterning slits 151" to divide the patterning slit 151" into the plurality of regions 151"a, 151"b, 151"c, and 151"d.

The number of supporting portions 153" located in the patterning slit 151" may vary according to the patterning slits 151". That is, three supporting portions 153" may be located in the patterning slit 151" that is located on the leftmost portion of the patterning slit sheet 150"; however, two supporting portions 153" may be located in the patterning slit 151" adjacent to the leftmost patterning slit 151".

Figure 10:
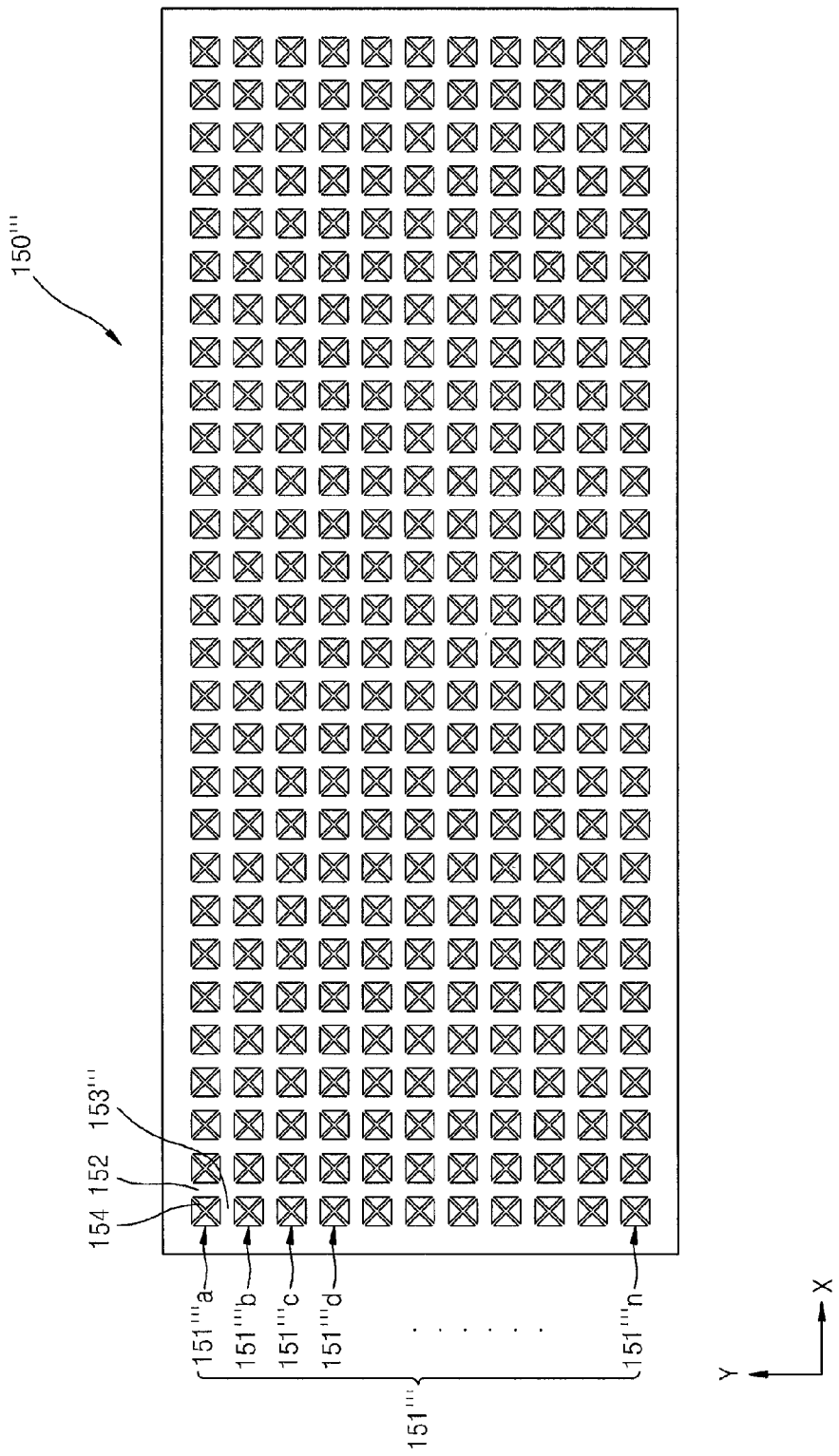
FIG. 10 is a schematic plan view illustrating another modified example of the patterning slit sheet according to an embodiment of the present invention.

FIG. 10 is a schematic plan view of another modified example of the patterning slit sheet 150''', according to an embodiment of the present invention. Referring to FIG. 10, the supporting portions 153''' are extended in the second direction (X-axis direction) that is perpendicular to the first direction (Y-axis direction) to connect the patterning slits 151''' to each other. In addition, the plurality of supporting portions 153''' are separated from each other in the first direction. Since the supporting portions 153''' are extended in a direction that is perpendicular to the length direction (first direction) of the patterning slits 151''' and separated from each other in the first direction, the supporting portions 153''' may divide each of the patterning slits 151''' into a plurality of patterning holes 151'''a, 151'''b, 151'''c, . . . , and 151'''n. The patterning holes 151'''a, 151'''b, 151'''c, 151'''n may be formed as squares. When the first direction and the second direction are perpendicular to each other, the patterning holes 151'''a, 151'''b, 151'''c, . . . , 151'''n may be rectangles.

A reinforcing member 154 may be located in each of the patterning holes 151'''a, 151'''b, 151'''c, 151'''n. The reinforcing member 154 may connect vertexes facing each other (e.g., opposing vertices) in each of the patterning holes 151'''a, 151'''b, 151'''c, . . . , 151'''n. As shown in FIG. 10, the reinforcing member 154 may be formed in an X-shape in each of the patterning holes 151'''a, 151'''b, 151'''c, . . . , 151'''n. The reinforcing member 154 may reduce distortion of the patterning slit sheet 150'''. That is, when the patterning slit sheet 150''' is coupled to the frame 155, four directions of the patterning slit sheet 150''' are pulled in order to prevent the patterning slit sheet 150''' from sagging. In other words, the patterning slit sheet 150''' may be pulled or stretched in opposite directions. When the four directions of the patterning slit sheet 150''' are pulled, an outer edge portion of the patterning slit sheet 150''' may be distorted and the shape of the patterning slits 151''' may be transformed. According to the present embodiment, the supporting portions 153 crossing the patterning slits 151''' and the reinforcing member 154 are formed in each of the patterning holes 151'''a, 151'''b, 151'''c, . . . , 151'''n, and thus, deformation of the patterning slit sheet 150''' caused during the tension of the patterning slit sheet 150''' may be reduced, and tensile force of the patterning slit sheet 150''' may be increased.

Figure 11:
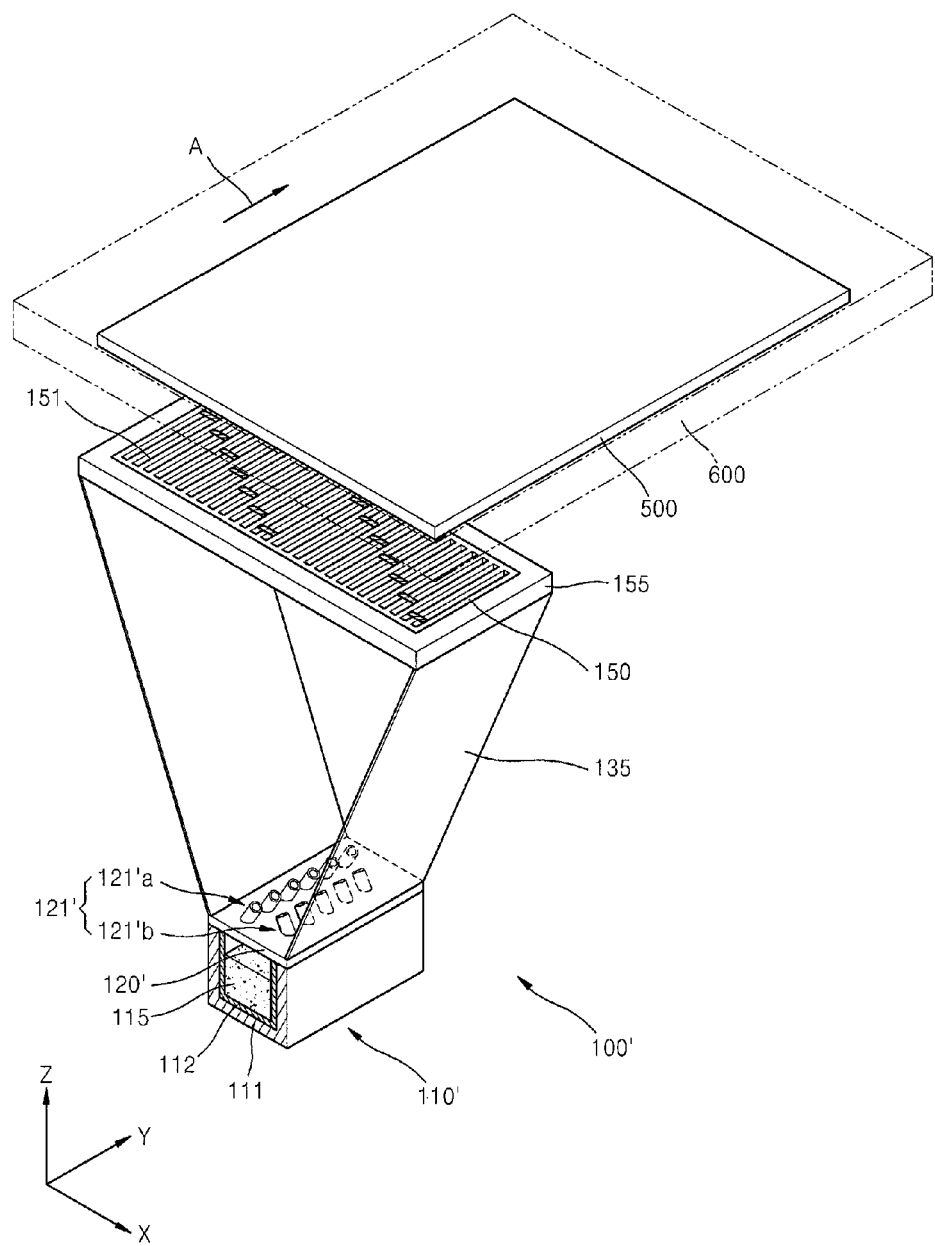
FIG. 11 is a schematic perspective view of a thin film deposition apparatus according to another embodiment of the present invention.

FIG. 11 is a schematic perspective view of a thin film deposition apparatus 100 according to another embodiment of the present invention. Referring to FIG. 11, the thin film deposition apparatus 100' includes the deposition source 110', the deposition source nozzle unit 120', and the patterning slit sheet 150. The deposition source 110' includes a crucible 112 that is filled with a deposition material 115, and a cooling block 111 that heats the crucible 112 to vaporize the deposition material 115, which is contained in the crucible 112, toward the deposition source nozzle unit 120. The deposition source nozzle unit 120', which has a planar shape, is located at a side of the deposition source 110'. The deposition source nozzle unit 120' includes a plurality of deposition source nozzles 121' arranged in the Y-axis direction. The patterning slit sheet 150 and a frame 155 are further located between the deposition source 110' and a substrate 500. The patterning slit sheet 150 has a plurality of patterning slits 151 arranged in parallel in the X-axis direction. The deposition source 110' and the deposition source nozzle unit 120' may be connected to the patterning slit sheet 150 by second connection units 135.

In the current embodiment, the plurality of deposition source nozzles 121' formed on the deposition source nozzle unit 120' are tilted (e.g., at a predetermined angle), unlike in the thin film deposition apparatus 100 of FIG. 3. In particular, the deposition source nozzles 121' may include deposition source nozzles 121'a and 121'b arranged in respective rows. In other embodiments, the deposition source nozzles 121'a and 121'b may be arranged in respective rows to alternate in a zigzag pattern. The deposition source nozzles 121'a and 121'b may be tilted (e.g., tilted by a predetermined angle) with respect to a YZ plane.

In the current embodiment of the present invention, the deposition source nozzles 121'a and 121'b are arranged to tilt at a predetermined angle to each other. The deposition source nozzles 121'a in a first row and the deposition source nozzles 121'b in a second row may tilt to face each other. That is, the deposition source nozzles 121a of the first row in a left part of the deposition source nozzle unit 120' may tilt to face a right side portion of the patterning slit sheet 150, and the deposition source nozzles 121'b of the second row in a right part of the deposition source nozzle unit 120' may tilt to face a left side portion of the patterning slit sheet 150.

Accordingly, a deposition rate of the deposition material 115 may be adjusted to lessen the difference between thicknesses of thin films formed on center and end portions of the substrate 500, thereby improving thickness uniformity. Moreover, utilization efficiency of the deposition material 115 may also be improved.

Figure 12:
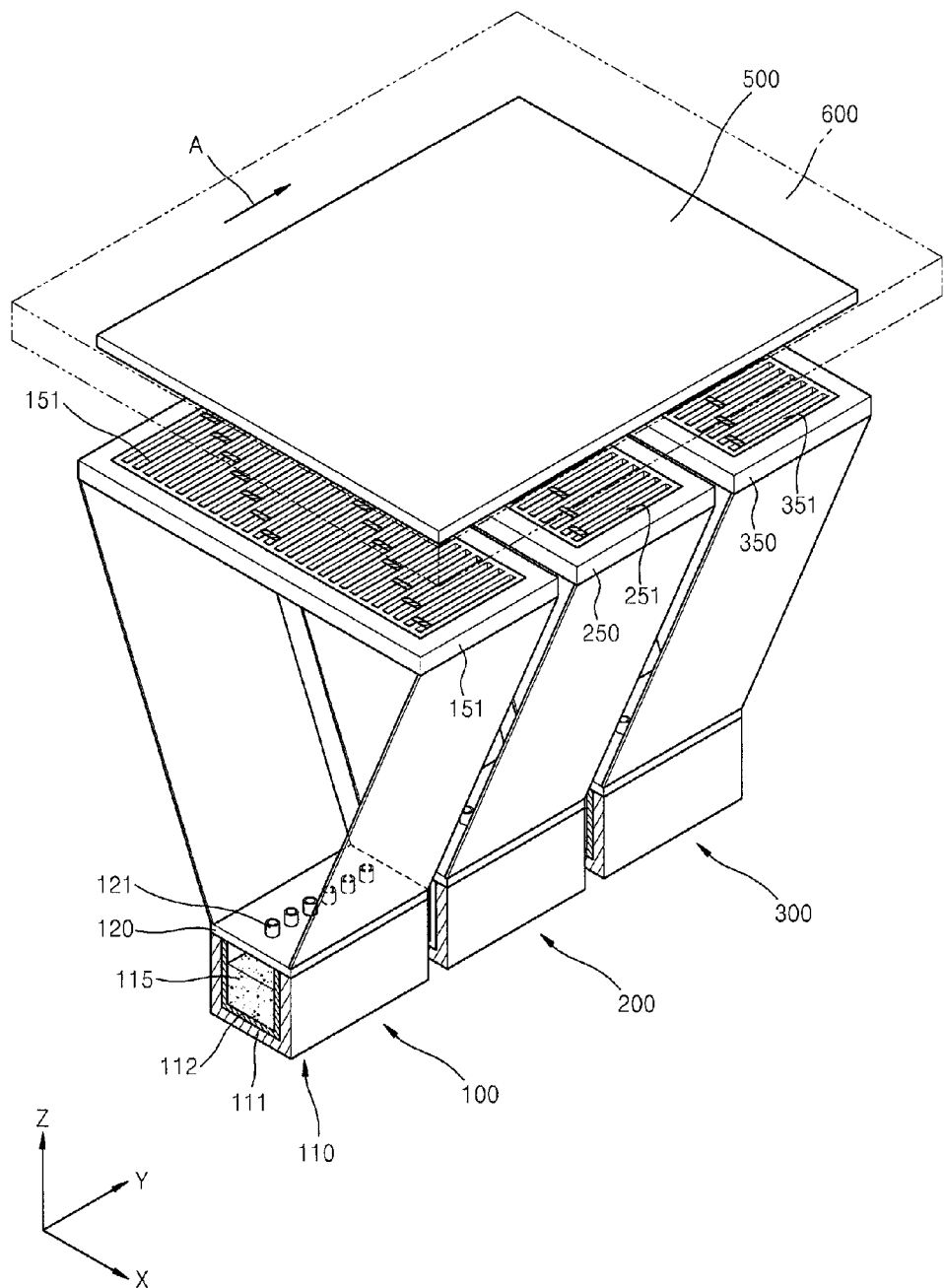
FIG. 12 is a schematic perspective cutaway view of a thin film deposition apparatus according to an embodiment of the present invention.

FIG. 12 is a schematic perspective view of a thin film deposition apparatus according to another embodiment of the present invention. Referring to FIG. 11, the thin film deposition apparatus according to the current embodiment includes a plurality of thin film deposition apparatuses 100 to 300, each of which has the structure of the thin film deposition apparatus 100 illustrated in FIGS. 4 through 6. In other words, the thin film deposition apparatus according to the current embodiment of the present invention, may include a multi-deposition source that concurrently (e.g., simultaneously) discharges deposition materials for forming a red (R) emission layer, a green (G) emission layer, and a blue (B) emission layer.

For example, the thin film deposition apparatus according to the current embodiment includes the first thin film deposition apparatus 100, the second thin film deposition apparatus 200, and the third thin film deposition apparatus 300. Each of the first thin film deposition apparatus 100, the second thin film deposition apparatus 200, and the third thin film deposition apparatus 300 has the same structure as the thin film deposition apparatus 100 described with reference to FIGS. 3 through 5, and thus a detailed description thereof will not be provided here.

The deposition sources 110 of the first thin film deposition apparatus 100, the second thin film deposition apparatus 200, and the third thin film deposition apparatus 300 may contain different deposition materials, respectively. The first thin film deposition apparatus 100 may contain a deposition material for forming the R emission layer, the second thin film deposition apparatus 200 may contain a deposition material for forming the G emission layer, and the third thin film deposition apparatus 300 may contain a deposition material for forming the B emission layer.

In other words, in a conventional method of manufacturing an organic light-emitting display device, a separate chamber and mask are used to form each color emission layer. However, when the thin film deposition apparatus according to the current embodiment of the present invention is used, the R emission layer, the G emission layer, and the B emission layer may be formed concurrently (e.g., at the same time) with a single multi-deposition source. Thus, the time it takes to manufacture an organic light-emitting display device is sharply reduced. In addition, the organic light-emitting display device may be manufactured with a reduced number of chambers, so that equipment costs may also be reduced (e.g., markedly reduced).

Although not illustrated, a patterning slit sheet 150 of the first thin film deposition apparatus 100, a patterning slit sheet 250 of the second thin film deposition apparatus 200, and a patterning slit sheet 350 of the third thin film deposition apparatus 300, may be arranged to be offset by a constant distance with respect to each other, thereby preventing deposition regions corresponding to the patterning slit sheets 150, 250, and 350 from overlapping with one another on the substrate 500. In other words, when the first thin film deposition apparatus 100, the second thin film deposition apparatus 200, and the third thin film deposition apparatus 300 are used to deposit the R emission layer, the G emission layer, and the B emission layer, respectively, patterning slits 151 of the first thin film deposition apparatus 100, patterning slits 251 of the second thin film deposition apparatus 200, and patterning slits 351 of the second thin film deposition apparatus 300 may be arranged not to be aligned with respect to each other, in order to form the R emission layer, the G emission layer, and the B emission layer in different regions of the substrate 500.

The deposition materials for forming the R emission layer, the G emission layer, and the B emission layer may be vaporized at different temperatures, respectively. Therefore, the temperatures of the deposition sources 110 of the respective first, second, and third thin film deposition apparatuses 100, 200, and 300 may be set to be different.

Although the thin film deposition apparatus according to the current embodiment of the present invention includes three thin film deposition apparatuses, the present invention is not limited thereto. In other words, a thin film deposition apparatus according to another embodiment of the present invention may include a plurality of thin film deposition apparatuses, each of which contains a different deposition material. For example, a thin film deposition apparatus according to another embodiment of the present invention may include five thin film deposition apparatuses respectively containing deposition materials for an R emission layer, a G emission layer, a B emission layer, an auxiliary layer (R') of the R emission layer, and an auxiliary layer (G') of the G emission layer.

As described above, a plurality of thin films may be formed concurrently (e.g., at the same time) with a plurality of thin film deposition apparatuses, and thus manufacturing yield and deposition efficiency may be improved. In addition, the overall manufacturing process may be simplified, and the manufacturing costs may be reduced.

Figure 13:
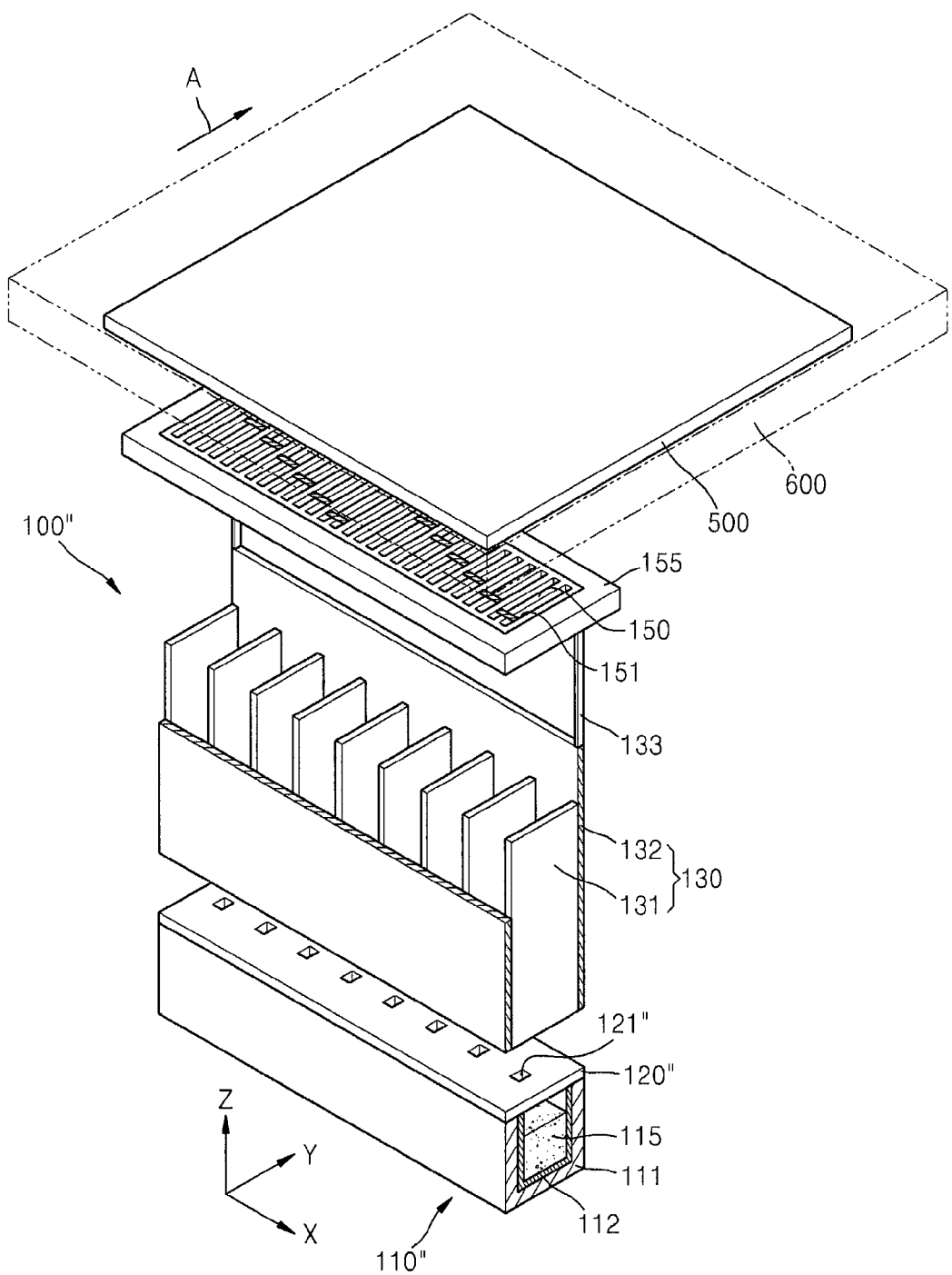
FIG. 13 is a schematic perspective cutaway view of a thin film deposition apparatus according to another embodiment of the present invention.
Figure 14:
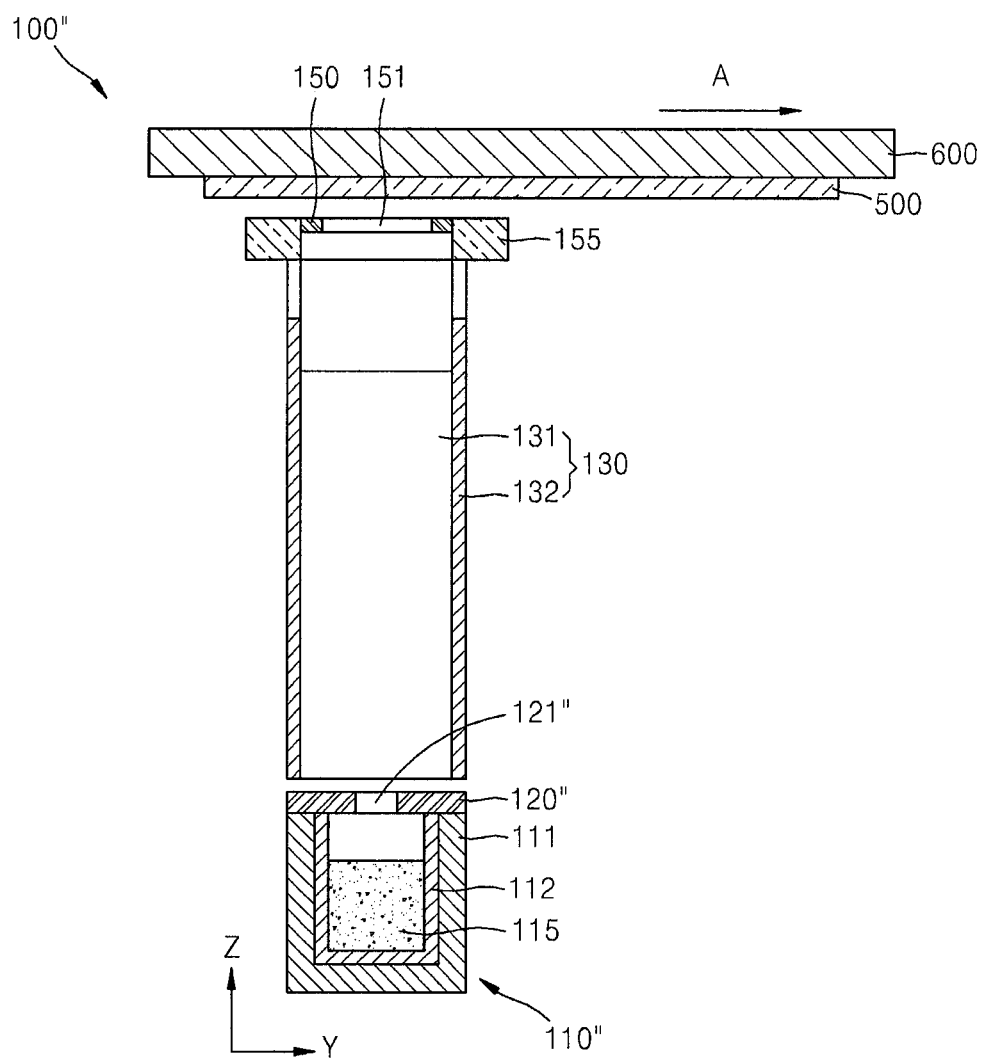
FIG. 14 is a schematic side sectional view of the thin film deposition apparatus of FIG. 13 in a plane parallel to the YZ plane.
Figure 15:
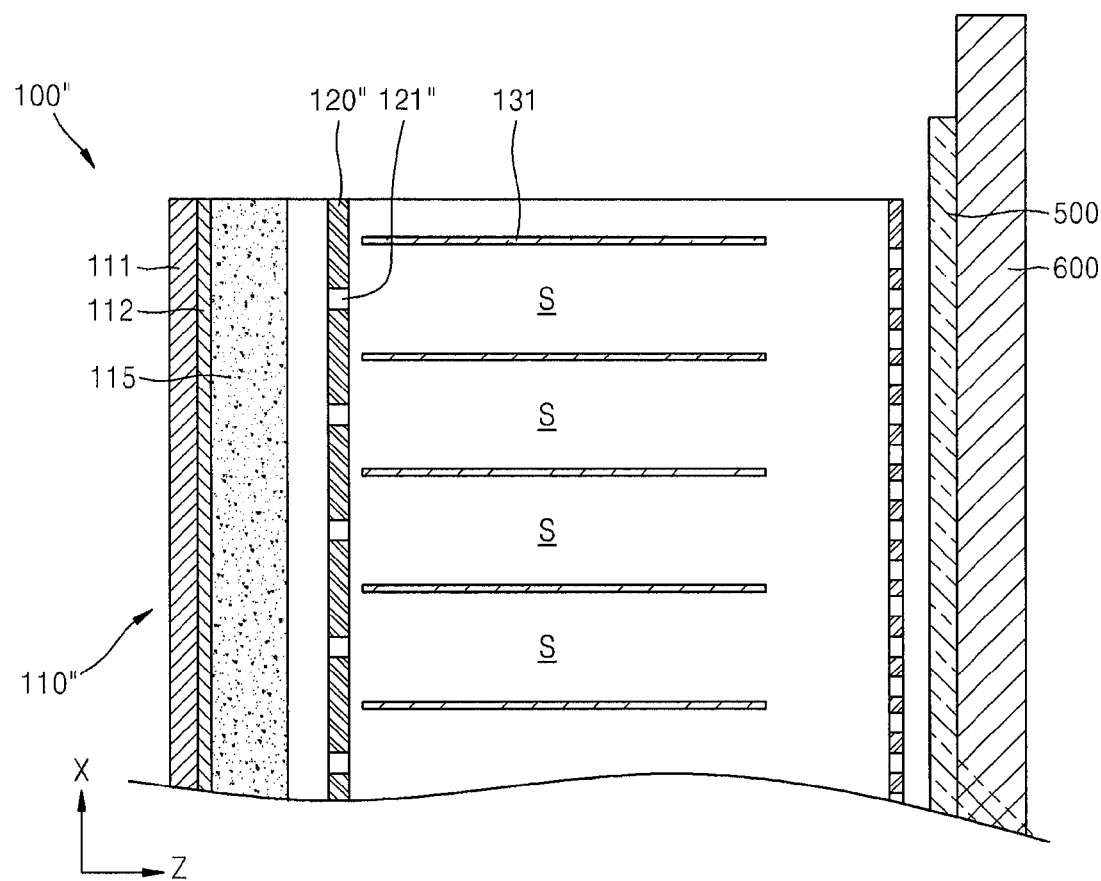
FIG. 15 is a schematic sectional plan view of the thin film deposition apparatus of FIG. 13 in a plane parallel to the XZ plane.

FIG. 13 is a schematic perspective cutaway view of a thin film deposition apparatus 100 according to an embodiment of the present invention. FIG. 14 is a schematic side sectional view of the thin film deposition apparatus 100 of FIG. 13 in a plane parallel to the YZ plane. FIG. 15 is a schematic sectional view of the thin film deposition apparatus 100 of FIG. 13 in a plane parallel to the XZ plane.

Referring to FIGS. 13 through 15, the thin film deposition apparatus 100" includes a deposition source 110", a deposition source nozzle unit 120", a barrier plate apparatus 130, and patterning slits 151.

Although a chamber is not illustrated in FIGS. 13 through 15 for convenience of explanation, all the components of the thin film deposition apparatus 100" may be located within a chamber that is maintained at an appropriate degree of vacuum. The chamber is maintained at an appropriate vacuum in order to allow a deposition material to move in a substantially straight line through the thin film deposition apparatus 100".

In the chamber, the substrate 500 that is a deposition target substrate is transferred by the electrostatic chuck 600. The substrate 500 may be a substrate for flat panel displays. A large substrate, such as a mother glass, for manufacturing a plurality of flat panel displays, may be used as the substrate 500. Other substrates may also be employed.

In an embodiment of the present invention, the substrate 500 may be moved relative to the thin film deposition apparatus 100". For example, the substrate 500 may be moved in a direction of an arrow A, relative to the thin film deposition apparatus 100".

Thus, as in the thin film deposition apparatus 100" of FIG. 3, a patterning slit sheet 150 included in the thin film deposition apparatus 100" according to the current embodiment may be smaller (e.g., significantly smaller) than an FMM used in a conventional deposition method. That is, in the thin film deposition apparatus 100, deposition is continuously performed, i.e., in a scanning manner while the substrate 500 is moved in the Y-axis direction. Thus, a length of the patterning slit sheet 150 in the Y-axis direction may be less (e.g., significantly less) than a length of the substrate 500, provided a width of the patterning slit sheet 150 in the X-axis direction and a width of the substrate 500 in the X-axis direction are substantially equal to each other. However, even when the width of the patterning slit sheet 150 in the X-axis direction is less than the width of the substrate 500 in the X-axis direction, deposition may be performed on the entire substrate 500 in the scanning manner while the substrate 500 or the thin film deposition apparatus 100" is moved relative to the other.

As described above, since the patterning slit sheet 150 may be formed significantly smaller than the FMM used in the conventional deposition method, it is relatively easy to manufacture the patterning slit sheet 150. In other words, using the patterning slit sheet 150, which is smaller than the FMM used in the conventional deposition method, is more convenient in all processes, including etching and other subsequent processes, such as precise extension, welding, moving, and cleaning processes, compared to the conventional deposition method using the larger FMM. This is more advantageous for a relatively large display device.

The deposition source 110" that contains and heats the deposition material 115 is located at an opposite side of the chamber to a side at which the substrate 500 is located.

The deposition source 110" includes a crucible 112 that is filled with the deposition material 115, and a cooling block 111 surrounding the crucible 112. The cooling block 111 prevents radiation of heat from the crucible 112 to the outside, i.e., into the chamber. The cooling block 111 may include a heater (not shown) that heats the crucible 112.

The deposition source nozzle unit 120" is located at a side of the deposition source 110, and in particular, at the side of the deposition source 110" facing the substrate 500. The deposition source nozzle unit 120" includes a plurality of deposition source nozzles 121" that may be arranged at equal intervals in the X-axis direction. The deposition material 115 that is vaporized in the deposition source 110" passes through the deposition source nozzles 121" of the deposition source nozzle unit 120" towards the substrate 500 that is a deposition target substrate.

The barrier plate assembly 130 is located at a side of the deposition source nozzle unit 120 facing the substrate 500. The barrier plate assembly 130 includes a plurality of barrier plates 131, and a barrier plate frame 132 that covers sides of the barrier plates 131. The plurality of barrier plates 131 may be arranged parallel to each other at equal intervals in the X-axis direction. In addition, each of the barrier plates 131 may be arranged parallel to the YZ plane in FIG. 13, and may have a rectangular shape. The plurality of barrier plates 131 arranged as described above partition the space between the deposition source nozzle unit 120" and the patterning slit sheet 150 into a plurality of sub-deposition spaces S. In the thin film deposition apparatus 100", as illustrated in FIG. 15, the deposition space is divided by the barrier plates 131 into the sub-deposition spaces S that respectively correspond to the deposition source nozzles 121" through which the deposition material 115 is discharged.

The barrier plates 131 may be respectively located between adjacent deposition source nozzles 121". In other words, each of the deposition source nozzles 121" may be located between two adjacent barrier plates 131. The deposition source nozzles 121" may be respectively located at the midpoint between two adjacent barrier plates 131. However, the present invention is not limited to this structure. For example, a plurality of deposition source nozzles 121" may be located between two adjacent barrier plates 131. In this case, the deposition source nozzles 121" may be also respectively located at the midpoint between two adjacent barrier plates 131.

As described above, since the barrier plates 131 partition the space between the deposition source nozzle unit 120" and the patterning slit sheet 150 into the plurality of sub-deposition spaces S, the deposition material 115 discharged through each of the deposition source nozzles 121" is not mixed with the deposition material 115 discharged through the other deposition source nozzles slits 121", and passes through the patterning slits 151 so as to be deposited on the substrate 500. In other words, the barrier plates 131 guide the deposition material 115, which is discharged through the deposition source nozzles slits 121", to move straight, i.e., to flow in the Z-axis direction.

As described above, the deposition material 115 is forced to move straight by installing the barrier plates 131, so that a smaller shadow zone may be formed on the substrate 500, compared to a case where no barrier plates are installed. Thus, the thin film deposition apparatus 100" and the substrate 500 can be separated (or spaced) from each other (e.g., spaced by a predetermined distance), as will be described later in detail.

The barrier plate frame 132, which covers the sides of the barrier plates 131, maintains the positions of the barrier plates 131, and guides the deposition material 115, which is discharged through the deposition source nozzles 121, not to flow in the Y-axis direction. It should be noted that in FIG. 13, a portion of the barrier plate frame 132 on the left side has been cutaway for illustrative purposes.

The deposition source nozzle unit 120" and the barrier plate assembly 130 may be separated (or spaced) from each other (e.g., by a predetermined distance). This may prevent heat radiated from the deposition source unit 110" from being conducted to the barrier plate assembly 130. However, aspects of the present invention are not limited to this. For example, an appropriate heat insulator (not shown) may be further located between the deposition source nozzle unit 120" and the barrier plate assembly 130. In this case, the deposition source nozzle unit 120" and the barrier plate assembly 130 may be bound together with the heat insulator therebetween.

In addition, the barrier plate assembly 130 may be constructed to be detachable from the thin film deposition apparatus 100". In the thin film deposition apparatus 100" according to the current embodiment, the deposition space is enclosed by using the barrier plate assembly 130, so that the deposition material 115 that remains undeposited may be mostly deposited within the barrier plate assembly 130. Thus, since the barrier plate assembly 130 is constructed to be detachable from the thin film deposition apparatus 100", when a large amount of the deposition material 115 lies in the barrier plate assembly 130 after a long deposition process, the barrier plate assembly 130 may be detached from the thin film deposition apparatus 100" and then placed in a separate deposition material recycling apparatus in order to recover the deposition material 115. Due to the structure of the thin film deposition apparatus 100" according to the present embodiment, a reuse rate of the deposition material 115 may be increased, so that the deposition efficiency may be improved, and thus the manufacturing costs may be reduced.

The patterning slit sheet 150 and a frame 155 are located between the deposition source 110" and the substrate 500. The frame 155 may be formed in a lattice shape, similar to a window frame. The patterning slit sheet 150 is bound inside the frame 155. The patterning slit sheet 150 has the plurality of patterning slits 151 arranged in the X-axis direction. The patterning slits 151 extend in the Y-axis direction. The deposition material 115 that has been vaporized in the deposition source 110" and passed through the deposition source nozzles 121, passes through the patterning slits 151 towards the substrate 500.

The patterning slit sheet 150 may be formed of a metal thin film. The patterning slit sheet 150 is fixed to the frame 150 such that a tensile force is exerted thereon. The patterning slits 151 may be formed by etching the patterning slit sheet 150 to a stripe pattern.

In the thin film deposition apparatus 100" according to the current embodiment, the total number of the patterning slits 151 may be greater than the total number of the deposition source nozzles 121". In addition, there may be a greater number of patterning slits 151 than deposition source nozzles 121" located between two adjacent barrier plates 131. The number of patterning slits 151 may be equal to the number of deposition patterns to be formed on the substrate 500.

The barrier plate assembly 130 and the patterning slit sheet 150 may be arranged to be separated (e.g., spaced) from each other (e.g., by a predetermined distance). Alternatively, the barrier plate assembly 130 and the patterning slit sheet 150 may be connected by second connection units 133. The temperature of the barrier plate assembly 130 may increase to 100° C. or higher due to the deposition source 110" whose temperature is high. Thus, the barrier plate assembly 130 and the patterning slit sheet 150 are separated (or spaced) from each other (e.g., by the predetermined distance) in order to prevent the heat of the barrier plate assembly 130 from being conducted to the patterning slit sheet 150.

As described above, the thin film deposition apparatus 100" according to the current embodiment performs deposition while being moved relative to the substrate 500. In order to move the thin film deposition apparatus 100" relative to the substrate 500, the patterning slit sheet 150 is separated (or spaced) from the substrate 500 (e.g., by a predetermined distance). In addition, in order to prevent the formation of a relatively large shadow zone on the substrate 500 when the patterning slit sheet 150 and the substrate 500 are separated from each other, the barrier plates 131 are arranged between the deposition source nozzle unit 120" and the patterning slit sheet 150 to force the deposition material 115 to move in a straight direction. Thus, the size of the shadow zone that may be formed on the substrate 500 may be reduced (e.g., sharply reduced).

For example, in a conventional deposition method using an FMM, deposition is performed with the FMM in close contact with a substrate in order to prevent formation of a shadow zone on the substrate. However, when the FMM is used in close contact with the substrate, the contact may cause defects, such as scratches, on patterns formed on the substrate. In addition, in the conventional deposition method, the size of the mask is the same as the size of the substrate since the mask cannot be moved relative to the substrate. Thus, the size of the mask is increased as display devices become larger. However, it is not easy to manufacture such a large mask.

In order to overcome this problem, in the thin film deposition apparatus 100" according to the current embodiment, the patterning slit sheet 150 is arranged to be separated (or spaced) from the substrate 500 (e.g., by a predetermined distance). This may be facilitated by installing the barrier plates 131 to reduce the size of the shadow zone formed on the substrate 500.

As described above, when the patterning slit sheet 150 is manufactured to be smaller than the substrate 500, the patterning slit sheet 150 may be moved relative to the substrate 500 during deposition. Thus, it is no longer necessary to manufacture a large FMM as used in the conventional deposition method. In addition, since the substrate 500 and the patterning slit sheet 150 are separated from each other, defects caused due to contact therebetween may be prevented. In addition, since it is unnecessary to contact the substrate 500 with the patterning slit sheet 150 during a deposition process, the manufacturing speed may be improved.

Figure 16:
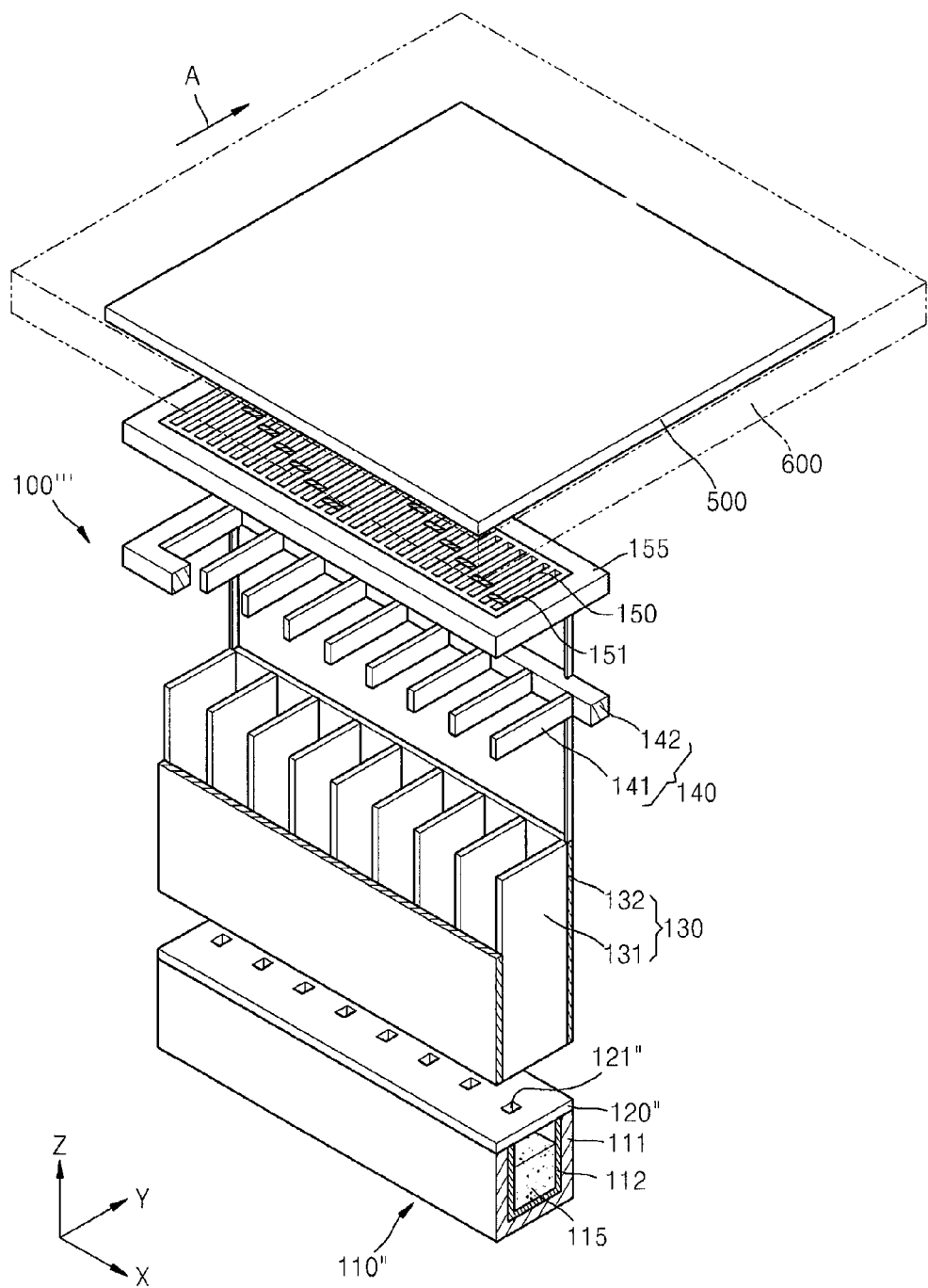
FIG. 16 is a schematic perspective cutaway view of a thin film deposition apparatus according to another embodiment of the present invention.

FIG. 16 is a schematic perspective view of a thin film deposition apparatus 100''' according to another embodiment of the present invention.

Referring to FIG. 16, the thin film deposition apparatus 100''' includes the deposition source 110", the deposition source nozzle unit 120", the first barrier plate assembly 130, the second barrier plate assembly 140, and the patterning slit sheet 150.

Although a chamber is not illustrated in FIG. 16 for convenience of explanation, all of the components of the thin film deposition apparatus 100''' may be located within a chamber that is maintained at an appropriate degree of vacuum. The chamber is maintained at an appropriate vacuum in order to allow a deposition material to move in a substantially straight line through the thin film deposition apparatus 100'''.

A substrate 500 that is a deposition target substrate is disposed in the chamber (not shown). The deposition source 110" that contains and heats the deposition material 115 is located at an opposite side of the chamber (not shown) to a side at which the substrate 500 is located.

The structures of the deposition source 110" and the patterning slit sheet 150 are the same as those in the embodiment described with reference to FIG. 13, and thus a detailed description thereof will not be provided here. The first barrier plate assembly 130 is also the same as the barrier plate assembly 130 of the embodiment described with reference to FIG. 13, and thus a detailed description thereof will not be provided here.

In the current embodiment, the second barrier plate assembly 140 is located at a side of the first barrier plate assembly 130. The second barrier plate assembly 140 includes a plurality of second barrier plates 141, and a second barrier plate frame 142 that covers sides of the plurality of second barrier plates 141. While a cutaway view of the second barrier plate assembly 140 is shown in FIG. 16, the second barrier plate frame 142 in practice may surround the second barrier plates 141.

The plurality of second barrier plates 141 may be arranged parallel to each other at equal intervals in the X-axis direction. In addition, each of the plurality of second barrier plates 141 may be formed to extend in the YZ plane in FIG. 8, i.e., perpendicular to the X-axis direction.

The plurality of first barrier plates 131 and second barrier plates 141 arranged as described above partition a deposition space between the deposition source nozzle unit 120″ and the patterning slit sheet 150. The deposition space is divided by the plurality of first barrier plates 131 and the plurality of second barrier plates 141 into sub-deposition spaces that respectively correspond to the deposition source nozzles 121″ through which the deposition material 115 is discharged.

The second barrier plates 141 may be arranged to correspond respectively to the first barrier plates 131. In other words, the second barrier plates 141 may be respectively arranged to be parallel to and to be on the same plane as the first barrier plates 131. That is, each pair of the corresponding first and second barrier plates 131 and 141 may be located on the same plane. The plurality of first barrier plates 131 and the plurality of second barrier plates 141 are respectively illustrated as having the same thickness in the X-axis direction, but aspects of the present invention are not limited thereto. For example, the second barrier plates 141, which are accurately aligned with the patterning slits 151, may be formed to be relatively thin, whereas the first barrier plates 131, which do not need to be precisely aligned with the patterning slits 151, may be formed to be relatively thick. This makes it easier to manufacture the thin film deposition apparatus 100‴.

A plurality of the thin film deposition apparatuses 100 according to the current embodiment may be successively arranged in the first chamber 731 of FIG. 1, as illustrated in FIG. 1. In this case, the plurality of thin film deposition apparatuses 100, 200, 300, and 400 may be used to deposit different deposition materials, respectively. For example, the plurality of thin film deposition apparatuses 100, 200, 300, and 400 may have different patterning slit patterns, so that pixels of different colors, for example, red, green, and blue, may be concurrently (e.g., simultaneously) defined through a film deposition process. In practice, each of the thin film deposition apparatuses 100, 200, 300, and 400 may be replaced by any suitable one of the thin film deposition apparatuses 100, 200, 300, 100′, 100″, and 100‴ in various different figures.

Figure 17:
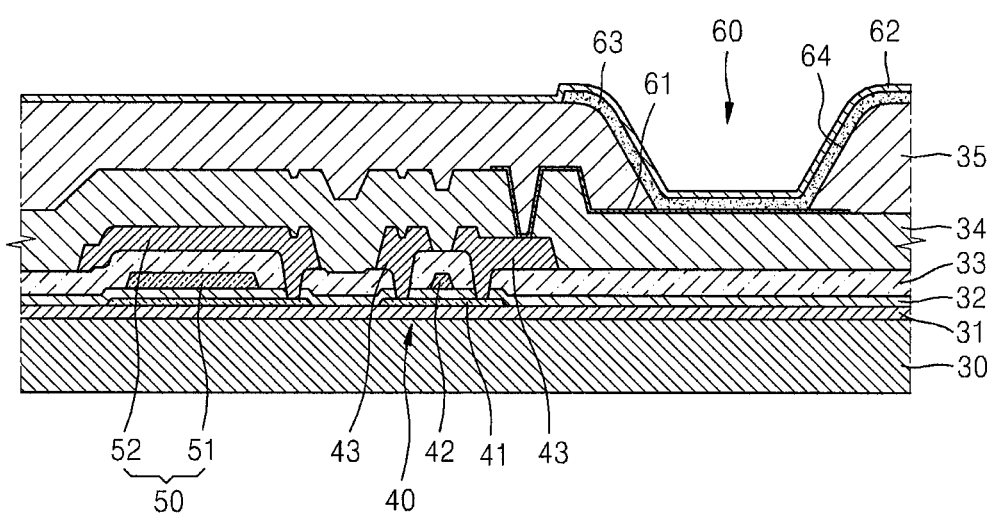
FIG. 17 is a cross-sectional view of an organic light-emitting display device manufactured using a thin film deposition apparatus, according to an embodiment of the present invention.

FIG. 17 is a cross-sectional view of an active matrix organic light-emitting display device fabricated by using a thin film deposition apparatus, according to an embodiment of the present invention.

Referring to FIG. 17, the active matrix organic light-emitting display device is formed on a substrate 30. The substrate 30 may be formed of a transparent material, for example, glass, plastic, or metal. An insulating layer 31, such as a buffer layer, is formed on an entire surface of the substrate 30.

Referring to FIG. 17, a thin film transistor (TFT) 40, a capacitor 50, and an organic light-emitting diode (OLED) 60 are located on the insulating layer 31.

A semiconductor active layer 41 is formed on the insulating layer 31 (e.g., formed in a predetermined pattern). A gate insulating layer 32 is formed to cover the semiconductor active layer 41. The semiconductor active layer 41 may include a p-type or n-type semiconductor material.

A gate electrode 42 of the TFT 40 is formed in a region of the gate insulating layer 32 corresponding to the semiconductor active layer 41. An interlayer insulating layer 33 is formed to cover the gate electrode 42. The interlayer insulating layer 33 and the gate insulating layer 32 are etched by, for example, dry etching, to form a contact hole exposing parts of the semiconductor active layer 41.

A source/drain electrode 43 is formed on the interlayer insulating layer 33 to contact the semiconductor active layer 41 through the contact hole. A passivation layer 34 is formed to cover the source/drain electrode 43, and is etched to expose a part of the drain electrode 43. An insulating layer (not shown) may be further formed on the passivation layer 34 so as to planarize the passivation layer 34.

In addition, the OLED 60 displays image information (e.g., predetermined image information) by emitting red, green, or blue light as current flows therethrough. The OLED 60 includes a first electrode 61 located on the passivation layer 34. The first electrode 61 is electrically connected to the drain electrode 43 of the TFT 40.

A pixel defining layer 35 is formed to cover the first electrode 61. An opening 64 is formed in the pixel defining layer 35, and an organic emission layer 63 is formed in a region defined by the opening 64. A second electrode 62 is formed on the organic emission layer 63.

The pixel defining layer 35, which defines individual pixels, is formed of an organic material. The pixel defining layer 35 also planarizes the surface of a region of the substrate 30 in which the first electrode 61 is formed, and in particular, the surface of the passivation layer 34.

The first electrode 61 and the second electrode 62 are insulated from each other, and respectively apply voltages of opposite polarities to the organic emission layer 63 to induce light emission.

The organic emission layer 63 may be formed of a low-molecular weight organic material or a high-molecular weight organic material. When a low-molecular weight organic material is used, the organic emission layer 63 may have a single or multi-layer structure including at least one selected from the group consisting of a hole injection layer (HIL), a hole transport layer (HTL), an emission layer (EML), an electron transport layer (ETL), and an electron injection layer (EIL). Examples of available organic materials may include copper phthalocyanine (CuPc), N,N'-di(naphthalene-1-yl)-N,N'-diphenyl-benzidine (NPB), tris-8-hydroxyquinoline aluminum (Alq3), and the like. Such a low-molecular weight organic material may be deposited using vacuum deposition by using a suitable one of the thin film deposition apparatuses illustrated in the drawings.

After the organic emission layer 63 is formed, the second electrode 62 may be formed by the same deposition method as used to form the organic emission layer 63.

The first electrode 61 may function as an anode, and the second electrode 62 may function as a cathode, and vice versa. The first electrode 61 may be patterned to correspond to individual pixel regions, and the second electrode 62 may be formed to cover all the pixels.

The first electrode 61 may be formed as a transparent electrode or a reflective electrode. Such a transparent electrode may be formed of indium tin oxide (ITO), indium zinc oxide (IZO), zinc oxide (ZnO), or indium oxide ($In_2O_3$). Such a reflective electrode may be formed by forming a reflective layer from silver (Ag), magnesium (Mg), aluminum (Al), platinum (Pt), palladium (Pd), gold (Au), nickel (Ni), neodymium (Nd), iridium (Ir), chromium (Cr) or a compound thereof and forming a layer of ITO, IZO, ZnO, or $In_2O_3$ on the reflective layer. The first electrode 61 may be formed by forming a layer by, for example, sputtering, and then patterning the layer by, for example, photolithography.

The second electrode 62 may also be formed as a transparent electrode or a reflective electrode. When the second electrode 62 is formed as a transparent electrode, the second electrode 62 functions as a cathode. To this end, such a transparent electrode may be formed by depositing a metal having a low work function, such as lithium (Li), calcium (Ca), lithium fluoride/calcium (LiF/Ca), lithium fluoride/aluminum (LiF/Al), aluminum (Al), silver (Ag), magnesium (Mg), or a compound thereof, on a surface of the organic emission layer 63 and forming an auxiliary electrode layer or a bus electrode line thereon from ITO, IZO, ZnO, $In_2O_3$, or the like. When the second electrode 62 is formed as a reflective electrode, the reflective layer may be formed by depositing Li, Ca, LiF/Ca, LiF/Al, Al, Ag, Mg, or a compound thereof on the organic emission layer 63. The second electrode 62 may be formed by using the same deposition method used to form the organic emission layer 63 described above.

The thin film deposition apparatuses according to the above embodiments of the present invention may be applied to form an organic layer or an inorganic layer of an organic TFT, and to form layers of various materials.

As described above, in the thin film deposition apparatus according to the present invention and the method of manufacturing an organic light-emitting display device according to the present invention by using the thin film deposition apparatus, the thin film deposition apparatus may be simply applied for the manufacture of large-size display devices on a mass scale. In addition, the thin film deposition apparatus and the organic-light-emitting display device may be easily manufactured, may improve manufacturing yield and deposition efficiency, and may allow deposition materials to be reused. Also, sagging of the patterning slit sheet may be prevented.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of manufacturing an organic light-emitting display device with a thin film deposition apparatus for forming a thin film on a substrate, the method comprising:
   arranging the substrate to be spaced from the thin film deposition apparatus;
   discharging a deposition material from a deposition source of the thin film deposition apparatus;
   passing the discharged deposition material through a deposition source nozzle unit of the thin film deposition apparatus, the deposition source nozzle unit being located at a side of the deposition source and comprising a plurality of deposition source nozzles arranged along a first direction;
   passing the discharged deposition material through a patterning slit sheet of the thin film deposition apparatus, the patterning slit sheet being located to face the deposition source nozzle unit and having a plurality of patterning slits, each of the plurality of patterning slits extending in the first direction and arranged along a second direction perpendicular to the first direction, the patterning slit sheet being supported by a plurality of supporting portions; and
   depositing the discharged deposition material from the patterning slit sheet onto the substrate,
   wherein the thin film deposition apparatus is configured to perform deposition while the thin film deposition apparatus or the substrate is moved relative to the other, and
   each of the plurality of supporting portions is not aligned in the second direction with any of the plurality of supporting portions which crosses adjacent ones of the plurality of patterning slits in the second direction,
   wherein at least one of the plurality of supporting portions crosses two or more neighboring patterning slits so as to support the patterning slit sheet, wherein the plurality of supporting portions divide the patterning slit into two or more regions, wherein the regions formed by one of the plurality of supporting portions have sizes different from the regions formed by an adjacent one of the plurality of supporting portions along the second direction.

2. The method of claim 1, wherein the depositing of the discharged deposition material on the substrate comprises continuously depositing the discharged deposition material on the substrate while the substrate is moved relative to the thin film deposition apparatus.

3. The method of claim 1, wherein the thin film deposition apparatus or the substrate is moved relative to the other in the first direction.

4. The method of claim 1, wherein the deposition source, the deposition source nozzle unit, and the patterning slit sheet are integrally formed as one body.

5. The method of claim 1, wherein the deposition source and the deposition source nozzle unit, and the patterning slit sheet are integrally connected as one body by connection units that guide movement of the deposition material.

6. The method of claim 5, wherein the connection units are configured to seal a space between the deposition source, the deposition source nozzle unit, and the patterning slit sheet.

7. The method of claim 1, wherein the plurality of deposition source nozzles are tilted at an angle.

8. The method of claim 7, wherein the plurality of deposition source nozzles comprises deposition source nozzles arranged in two rows in the first direction, and the deposition source nozzles in the two rows are tilted to face each other.

9. The method of claim 7, wherein the plurality of deposition source nozzles comprises deposition source nozzles arranged in two rows formed in the first direction,
   the deposition source nozzles of one of the two rows located at a first side of the patterning slit sheet are arranged to face a second side of the patterning slit sheet, and
   the deposition source nozzles of the other one of the two rows located at the second side of the patterning slit sheet are arranged to face the first side of the patterning slit sheet.

10. The method of claim 1, wherein at least one of the plurality of supporting portions crosses a length direction of the patterning slits.

11. The method of claim 10, wherein at least one of the plurality of supporting portions is arranged perpendicularly to the length direction of the patterning slits.

12. The method of claim 10, wherein at least one of the plurality of supporting portions comprises a plurality of supporting portions.

13. The method of claim 1, wherein an arrangement of the supporting portions located on one of the plurality of patterning slits is different from an arrangement of the supporting portions located on other patterning slits adjacent to the patterning slit.

14. The method of claim 12, wherein the supporting portions extend in the second direction and are separated from each other in the first direction.

15. The method of claim 14, wherein the supporting portions are arranged at equal intervals.

16. A method of manufacturing an organic light-emitting display device with a thin film deposition apparatus for forming a thin film on a substrate, the method comprising:
arranging the substrate to be spaced from the thin film deposition apparatus;
discharging a deposition material from a deposition source of the thin film deposition apparatus;
passing the discharged deposition material through a deposition source nozzle unit of the thin film deposition apparatus, the deposition source nozzle unit being located at a side of the deposition source and comprising a plurality of deposition source nozzles arranged along a first direction;
passing the discharged deposition material through a patterning slit sheet of the thin film deposition apparatus, the patterning slit sheet being located to face the deposition source nozzle unit and having a plurality of patterning slits, each of the plurality of patterning slits extending in the first direction and arranged along a second direction perpendicular to the first direction, the patterning slit sheet being supported by a plurality of supporting portions, each of the plurality of patterning slits being divided into a plurality of rectangular or square shape patterning openings by the plurality of supporting portions, a plurality of reinforcing members diagonally connecting opposite corners of one of the plurality of rectangular or square shape patterning openings to each other; and
depositing the discharged deposition material from the patterning slit sheet onto the substrate,
wherein the thin film deposition apparatus is configured to perform deposition while the thin film deposition apparatus or the substrate is moved relative to the other, and
each of the plurality of supporting portions is not aligned in the second direction with any of the plurality of supporting portions which crosses adjacent ones of the plurality of patterning slits in the second direction.

17. The method of claim 1 further comprising:
passing the discharged deposition material through a plurality of sub-deposition spaces, the plurality of sub-deposition spaces being defined by a barrier plate assembly comprising a plurality of barrier plates that are located between the deposition source nozzle unit and the patterning slit sheet, the barrier plates defining the plurality of sub-deposition spaces by partitioning a space between the deposition source nozzle unit and the patterning slit sheet into the plurality of sub-deposition spaces.

18. The method of claim 17, wherein the plurality of barrier plates extend in a third direction substantially perpendicular to the first and second directions, and the plurality of deposition source nozzles are arranged in the second direction.

19. The method of claim 17, wherein the barrier plate assembly comprises a first barrier plate assembly comprising a plurality of first barrier plates, and a second barrier plate assembly comprising a plurality of second barrier plates.

20. The method of claim 19, wherein the plurality of first barrier plates and the plurality of second barrier plates extend in a third direction substantially perpendicular to the first and second directions.

21. The method of claim 20, wherein the plurality of first barrier plates are arranged to respectively correspond to the plurality of second barrier plates.

22. The method of claim 17, wherein the deposition source is spaced from the barrier plate assembly.

23. The method of claim 17, wherein the barrier plate assembly is spaced from the patterning slit sheet.

24. The method of claim 17, wherein each of the plurality of supporting portions crosses a length direction of the patterning slits.

25. The method of claim 24, wherein each of the plurality of supporting portions is arranged perpendicularly to the length direction of the patterning slits.

26. The method of claim 24, wherein each of the plurality of supporting portions crosses two or more neighboring patterning slits so as to support the patterning slit sheet.

27. The method of claim 24, wherein the plurality of supporting portions divide one of the patterning slits into two or more regions.

28. The method of claim 27, wherein an arrangement of the supporting portions located at one of the plurality of patterning slits is different from an arrangement of the supporting portions located at other ones of the patterning slits adjacent to the one of the patterning slits.

29. The method of claim 24, wherein the plurality of supporting portions extend in the second direction and are separated from each other in the first direction.

30. The method of claim 29, wherein the supporting portions are arranged at equal intervals.

31. A method of manufacturing an organic light-emitting display device with a thin film deposition apparatus for forming a thin film on a substrate, the method comprising:
arranging the substrate to be spaced from the thin film deposition apparatus;
discharging a deposition material from a deposition source of the thin film deposition apparatus;
passing the discharged deposition material through a deposition source nozzle unit of the thin film deposition apparatus, the deposition source nozzle unit being located at a side of the deposition source and comprising a plurality of deposition source nozzles arranged along a first direction;
passing the discharged deposition material through a plurality of sub-deposition spaces, the plurality of sub-deposition spaces being defined by a barrier plate assembly comprising a plurality of barrier plates that are located between the deposition source nozzle unit and a patterning slit sheet, each of the plurality of sub-deposition spaces being defined by at least two of the plurality of barrier plates;
passing the discharged deposition material through the patterning slit sheet of the thin film deposition apparatus, the patterning slit sheet being spaced from the barrier plate assembly and located to face the deposition source nozzle unit, the patterning slit sheet having a plurality of patterning slits, each of the plurality of patterning slits extending in the first direction and arranged along a second direction perpendicular to the first direction, the patterning slit sheet being supported by a plurality of supporting portions, each of the plurality of patterning slits being divided into a plurality of rectangular or square patterning openings by the plurality of supporting portions, a plurality of reinforcing members diagonally connecting opposite corners of one of the plurality of rectangular or square shape patterning openings to each other; and depositing the discharged deposition material from the patterning slit sheet onto the substrate, wherein the thin film deposition apparatus is configured to perform deposition while the thin film deposition apparatus or the substrate is moved relative to the other, and each of the plurality of supporting portions is not aligned in the second direction with any of the plurality of supporting portions which crosses adjacent ones of the plurality of patterning slits in the second direction.

\* \* \* \* \*